United States Patent
Fouquet et al.

(10) Patent No.: US 9,019,057 B2
(45) Date of Patent: Apr. 28, 2015

(54) GALVANIC ISOLATORS AND COIL TRANSDUCERS

(75) Inventors: Julie E. Fouquet, Portola Valley, CA (US); Gek Yong Ng, Singapore (SG); Richard Baumgartner, Palo Alto, CA (US); Gary R. Trott, San Mateo, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1819 days.

(21) Appl. No.: 12/059,979

(22) Filed: Mar. 31, 2008

(65) Prior Publication Data
US 2008/0179963 A1     Jul. 31, 2008

Related U.S. Application Data

(63) Continuation-in-part of application No. 11/512,034, filed on Aug. 28, 2006, and a continuation-in-part of application No. 11/747,092, filed on May 10, 2007, now abandoned.

(51) Int. Cl.
  *H01F 5/00*     (2006.01)
  *H01F 27/06*    (2006.01)
  (Continued)

(52) U.S. Cl.
  CPC ............ *H01F 19/08* (2013.01); *H01F 27/2804* (2013.01); *H03F 3/45192* (2013.01); *H03F 3/45475* (2013.01); *H03H 7/52* (2013.01); *H04L 25/0266* (2013.01); *H01F 17/0006* (2013.01); *H01F 17/0013* (2013.01); *H01F 27/40* (2013.01); *H01F 2019/085* (2013.01);
  (Continued)

(58) Field of Classification Search
  USPC .............................. 336/65, 200, 206–208, 232
  See application file for complete search history.

(56) References Cited

U.S. PATENT DOCUMENTS

| | | | |
|---|---|---|---|
| 4,027,152 A | 5/1977 | Brown et al. | |
| 4,236,086 A | 11/1980 | Hoebel | |
| 4,494,100 A | 1/1985 | Stengel et al. | |
| 4,541,894 A | 9/1985 | Cassat | |
| 4,931,075 A | 6/1990 | Kuhn | |
| 5,015,972 A | 5/1991 | Cygan et al. | |
| 5,070,317 A | 12/1991 | Bhagat | |
| 5,312,674 A | 5/1994 | Haertling et al. | |
| 5,363,081 A * | 11/1994 | Bando et al. | 336/200 |

(Continued)

FOREIGN PATENT DOCUMENTS

| | | |
|---|---|---|
| CN | 1180277 | 6/1996 |
| CN | 1237081 | 12/1999 |

(Continued)

OTHER PUBLICATIONS

ACCL-9xxx 3.3V/5V High Speed CMOS Capacitive Isolator, Preliminary Datasheat, Avago Technologies, Date unknown.

(Continued)

*Primary Examiner* — Tsz Chan

(57) ABSTRACT

Disclosed herein are various embodiments of coil transducers and galvanic isolators configured to provide high voltage isolation and high voltage breakdown performance characteristics in small packages. A coil transducer is provided across which data or power signals may be transmitted and received by primary and secondary coils disposed on opposing sides thereof without high voltage breakdowns occurring therebetween. At least portions of the coil transducer are formed of an electrically insulating, non-metallic, non-semiconductor, low dielectric loss material. Circuits are disclosed herein that permit high speed data signals to be transmitted through the coil transducer and faithfully and accurately reconstructed on the opposing side thereof. The coil transducer may be formed in a small package using, by way of example, printed circuit board, CMOS and other fabrication and packaging processes.

30 Claims, 17 Drawing Sheets

(51) Int. Cl.
  *H01F 27/30* (2006.01)
  *H01F 27/28* (2006.01)
  *H01F 19/08* (2006.01)
  *H03F 3/45* (2006.01)
  *H03H 7/52* (2006.01)
  *H04L 25/02* (2006.01)
  *H01F 17/00* (2006.01)
  *H01F 27/40* (2006.01)

(52) U.S. Cl.
  CPC ............ *H03F2203/45008* (2013.01); *H03F 2203/45101* (2013.01); *H03F 2203/45586* (2013.01); *H01L 2224/48091* (2013.01); *H01L 2224/48195* (2013.01); *H01L 2224/49175* (2013.01); *H01L 2924/3011* (2013.01)

(56) References Cited

U.S. PATENT DOCUMENTS

| | | | |
|---|---|---|---|
| 5,420,558 | A | 5/1995 | Ito et al. |
| 5,504,668 | A | 4/1996 | Beyerlein |
| 5,597,979 | A | 1/1997 | Courtney et al. |
| 5,659,462 | A | 8/1997 | Chen et al. |
| 5,693,971 | A | 12/1997 | Gonzalez |
| 5,716,713 | A * | 2/1998 | Zsamboky et al. ............ 428/457 |
| 5,754,088 | A | 5/1998 | Fletcher et al. |
| 5,768,111 | A | 6/1998 | Zaitsu |
| 5,825,259 | A | 10/1998 | Harpham |
| 5,952,849 | A | 9/1999 | Haigh |
| 6,167,475 | A | 12/2000 | Carr |
| 6,175,293 | B1 | 1/2001 | Hasegawa et al. |
| 6,198,374 | B1 | 3/2001 | Abel |
| 6,215,377 | B1 | 4/2001 | Douriet et al. |
| 6,255,714 | B1 | 7/2001 | Kossives et al. |
| 6,300,617 | B1 | 10/2001 | Daughton |
| 6,307,457 | B1 | 10/2001 | Wissink et al. |
| 6,320,532 | B1 | 11/2001 | Diede |
| 6,404,317 | B1 | 6/2002 | Mizoguchi et al. |
| 6,476,704 | B2 | 11/2002 | Goff |
| 6,489,850 | B2 | 12/2002 | Heineke et al. |
| 6,501,364 | B1 | 12/2002 | Hui et al. |
| 6,525,566 | B2 | 2/2003 | Haigh et al. |
| 6,538,313 | B1 | 3/2003 | Smith |
| 6,545,059 | B1 | 4/2003 | Fichou |
| 6,556,117 | B1 | 4/2003 | Nakao et al. |
| 6,574,091 | B2 | 6/2003 | Heineke et al. |
| 6,661,079 | B1 | 12/2003 | Bikulcius |
| 6,686,825 | B2 | 2/2004 | Tamezawa et al. |
| 6,856,226 | B2 | 2/2005 | Gardner |
| 6,859,130 | B2 | 2/2005 | Nakashima et al. |
| 6,867,678 | B2 | 3/2005 | Yang |
| 6,870,456 | B2 | 3/2005 | Gardner |
| 6,873,065 | B2 | 3/2005 | Haigh et al. |
| 6,888,438 | B2 * | 5/2005 | Hui et al. ...................... 336/200 |
| 6,891,461 | B2 | 5/2005 | Gardner |
| 6,903,578 | B2 | 6/2005 | Haigh et al. |
| 6,919,775 | B2 | 7/2005 | Wendt et al. |
| 6,922,080 | B2 | 7/2005 | Haigh et al. |
| 6,943,658 | B2 | 9/2005 | Gardner |
| 6,944,009 | B2 | 9/2005 | Nguyen et al. |
| 7,016,490 | B2 | 3/2006 | Beutler et al. |
| 7,064,442 | B1 | 6/2006 | Lane et al. |
| 7,064,662 | B2 | 6/2006 | Goggin |
| 7,170,807 | B2 | 1/2007 | Fazan et al. |
| 7,171,739 | B2 | 2/2007 | Yang et al. |
| 7,302,247 | B2 | 11/2007 | Dupuis |
| 7,376,212 | B2 | 5/2008 | Dupuis |
| 7,421,028 | B2 | 9/2008 | Dupuis |
| 7,425,787 | B2 | 9/2008 | Larson, III |
| 7,436,282 | B2 | 10/2008 | Whittaker et al. |
| 7,447,492 | B2 | 11/2008 | Dupuis |
| 7,460,604 | B2 | 12/2008 | Dupuis |
| 7,545,059 | B2 | 6/2009 | Chen |
| 7,577,223 | B2 | 8/2009 | Alfano |
| 7,650,130 | B2 | 1/2010 | Dupuis |
| 7,683,654 | B2 | 3/2010 | Chen |
| 7,692,444 | B2 | 4/2010 | Chen |
| 7,719,305 | B2 | 5/2010 | Chen |
| 7,737,871 | B2 | 6/2010 | Leung et al. |
| 7,738,568 | B2 | 6/2010 | Alfano |
| 7,741,943 | B2 | 6/2010 | Fouquet |
| 7,746,943 | B2 | 6/2010 | Yamaura |
| 7,821,428 | B2 | 10/2010 | Laung |
| 7,856,219 | B2 | 12/2010 | Dupuis |
| 7,920,010 | B2 | 4/2011 | Chen |
| 7,932,799 | B2 | 4/2011 | Loef et al. |
| 7,948,067 | B2 | 5/2011 | Ho |
| 8,049,573 | B2 | 11/2011 | Alfano |
| 8,061,017 | B2 | 11/2011 | Fouquet |
| 8,064,872 | B2 | 11/2011 | Dupuis |
| 8,093,983 | B2 | 1/2012 | Fouquet |
| 2002/0075116 | A1 | 6/2002 | Peels et al. |
| 2002/0110013 | A1 | 8/2002 | Park et al. |
| 2002/0135236 | A1 | 9/2002 | Haigh |
| 2003/0042571 | A1 * | 3/2003 | Chen et al. .................. 257/531 |
| 2004/0056749 | A1 * | 3/2004 | Kahlmann et al. ............ 336/200 |
| 2005/0003199 | A1 * | 1/2005 | Takaya et al. ................. 428/413 |
| 2005/0057277 | A1 | 3/2005 | Chen et al. |
| 2005/0077993 | A1 | 4/2005 | Kanno et al. |
| 2005/0094302 | A1 | 5/2005 | Matsuzaki et al. |
| 2005/0128038 | A1 | 6/2005 | Hyvonen |
| 2005/0133249 | A1 | 6/2005 | Fujii |
| 2005/0269657 | A1 | 12/2005 | Dupuis |
| 2005/0272378 | A1 | 12/2005 | Dupuis |
| 2006/0028313 | A1 | 2/2006 | Strzalkowski et al. |
| 2006/0152322 | A1 | 7/2006 | Whittaker et al. |
| 2006/0170527 | A1 | 8/2006 | Braunisch |
| 2006/0176137 | A1 | 8/2006 | Sato et al. |
| 2006/0214759 | A1 | 9/2006 | Kawaraj |
| 2006/0220775 | A1 | 10/2006 | Ishikawa |
| 2007/0080587 | A1 | 4/2007 | Ruizenaar et al. |
| 2007/0085447 | A1 | 4/2007 | Larson, III |
| 2007/0085632 | A1 | 4/2007 | Larson, III et al. |
| 2007/0086274 | A1 | 4/2007 | Nishimura et al. |
| 2007/0133933 | A1 | 6/2007 | Yoon et al. |
| 2007/0281394 | A1 | 12/2007 | Kawabe et al. |
| 2007/0290784 | A1 | 12/2007 | Nesse et al. |
| 2008/0007382 | A1 | 1/2008 | Snyder |
| 2008/0030080 | A1 | 2/2008 | Chen et al. |
| 2008/0031286 | A1 | 2/2008 | Alfano et al. |
| 2008/0051158 | A1 | 2/2008 | Male et al. |
| 2008/0174396 | A1 | 7/2008 | Choi et al. |
| 2008/0176362 | A1 | 7/2008 | Sengupta et al. |
| 2008/0179963 | A1 | 7/2008 | Fouquet et al. |
| 2008/0180206 | A1 | 7/2008 | Fouquet |
| 2008/0198904 | A1 | 8/2008 | Chang |
| 2008/0278255 | A1 | 11/2008 | Harvey et al. |
| 2008/0278275 | A1 | 11/2008 | Fouquet |
| 2008/0284552 | A1 | 11/2008 | Lim et al. |
| 2008/0308817 | A1 | 12/2008 | Wang et al. |
| 2008/0311862 | A1 | 12/2008 | Spina |
| 2009/0072819 | A1 | 3/2009 | Takahashi |
| 2009/0243782 | A1 | 10/2009 | Fouquet et al. |
| 2009/0243783 | A1 | 10/2009 | Fouquet et al. |
| 2009/0268486 | A1 | 10/2009 | Ljusev et al. |
| 2010/0020448 | A1 | 1/2010 | Ng et al. |
| 2010/0052120 | A1 | 3/2010 | Pruitt |
| 2010/0176660 | A1 | 7/2010 | Fouquet |
| 2010/0188182 | A1 | 7/2010 | Fouquet et al. |
| 2010/0259909 | A1 | 10/2010 | Ho et al. |
| 2010/0328902 | A1 | 12/2010 | Ho et al. |
| 2011/0075449 | A1 | 3/2011 | Fouquet |
| 2011/0095620 | A1 | 4/2011 | Fouquet |

FOREIGN PATENT DOCUMENTS

| | | |
|---|---|---|
| DE | 19911133 | 10/2000 |
| DE | 10154906 | 5/2003 |
| EP | 1309033 | 5/2003 |
| EP | 1617337 | 1/2006 |
| GB | 2403072 | 6/2004 |
| JP | 57-39598 | 3/1982 |
| JP | 61-59714 | 3/1986 |

(56) References Cited

FOREIGN PATENT DOCUMENTS

| | | |
|---|---|---|
| JP | 3171705 | 7/1991 |
| JP | 06-53052 | 2/1994 |
| JP | 08-236696 | 9/1996 |
| JP | 08-241955 | 9/1996 |
| JP | 10-150068 | 6/1998 |
| JP | 2000-114047 | 4/2000 |
| JP | 2000-508116 | 6/2000 |
| JP | 2001-258022 | 9/2001 |
| JP | 2002-260936 | 9/2002 |
| JP | 2003-17338 | 1/2003 |
| JP | 2003-151829 | 5/2003 |
| JP | 2005-513824 | 5/2005 |
| JP | 2007-086285 | 4/2007 |
| JP | 2008-061236 | 3/2008 |
| JP | 2008-236365 | 10/2008 |
| JP | 2008-289257 | 11/2008 |
| JP | 2009-035028 | 2/2009 |
| JP | 2009-094576 | 4/2009 |
| JP | 2010-212669 | 9/2010 |
| WO | WO-9734349 | 3/1997 |
| WO | WO 2005/001928 | 6/2005 |
| WO | WO 2006/033071 | 3/2006 |
| WO | WO 2007/086285 | 8/2007 |
| WO | WO 2009/035028 | 3/2009 |

OTHER PUBLICATIONS

Texas Instruments Dual Digital Isolators. SLLS755E. Jul. 2007.
"Off the Shelf SMT Planar Transformers," Payton Group International, Date Unknown.
IEEE Abstract for "Meaasurements of Permittivity. Loss Dielectric Tangent, and Resistivity of Float-Zone Silicon at Microwave Frequencies," Krupka et al., Microwave Theory and Techniques, IEE Transactiond, Nov. 2008, vol. 54, issue 11. pp. 3995-4001.
"Planar Transformers Make Maximum Use of Precious Board Space," Electronic Design, Mar. 9, 1998. ED Online ID #7647.
Analog Devices iCoupler Digital Isolator ADuM1100 Data Sheet, Rev. F, 2006.
U.S. Appl. No. 11/264,956, filed Nov. 1, 2005, Guenin et al.
U.S. Appl. No. 11/512,034, filed Aug. 28, 2006, Fouquet et al.
U.S. Appl. No. 11/747,092, filed May 10, 2007, Fouquet et al.
"iCoupler Products with Iso Power Technology: Signal and Power Transfer Across Isolation Barrier Using Microtransformers" to Chen; 2008, Abnalog Devices.
"Loss Characteristics of Silicon Substrate with Different Resistivities" to Yang et al., Microwave and Optical Technology Letters, vol. 48, No. 9, Sep. 2006.
"Advanced Circuit Materials, High Frequency Laminates and Flexible Circuit Materials," Rogers Corp., www.rogerscorporation.com/mwu/translations/prod.htm, website addresses accessed Mar. 24, 2008.
"Allfex Flexible Printed Circuits", *Design Guide*.
Myers, John et al., "GMR Isolators", *Nonvalatile Electronics, Inc.* 1998.
Analog Devices, "iCoupler R Digital Isolation Products", 2005.
Chen, Baoxang et al., "High Speed Digital Isolators Using Microscale On-Chip Transformers", Jul. 22, 2003.
Kliger, R. , "Integrated Transformer-Coupled Isolation", Mar. 2003
Smith, Carl H. et al., "Chip-Size Magnetic Sensor Arrays", May 21, 2002.
Oljaca, Miroslav , "Interfacing the ADS1202 Modulator with a Pulse Transformer in Galvanically Isolated Systems", *SBAA096* Jun. 2003 , 22 pages.
Biersach et al., "Designing Medical Electrical Equipment to Meet Safety Certification and Regulatory Requirements", Underwriters Laboratories, 6 pages, Table 2, Jan. 2002.
Doane et al., "Multichip Module Technologies and Alternatives— The Basics", Section 5.3.2, p. 185, 1993.

\* cited by examiner

GALVANIC ISOLATORS AND COIL TRANSDUCERS

RELATED APPLICATIONS

This application claims priority and other benefits from, and is a continuation-in-part of, U.S. patent application Ser. No. 11/512,034 filed Aug. 28, 2006 entitled "Improved Galvanic Isolator" to Fouquet et al., and U.S. patent application Ser. No. 11/747,092 filed May 10, 2007 entitled "Miniature Transformers Adapted for Use in Galvanic Isolators and the Like" to Fouquet et al. This application also hereby incorporates by reference, in its entirety, U.S. Pat. No. 7,852,186 filed on even date herewith entitled "Coil Transducer with Reduced Arcing and Improved High Voltage Breakdown Performance Characteristics" to Fouquet et al.

FIELD OF THE INVENTION

Various embodiments of the invention described herein relate to the field of data signal and power transformers or galvanic isolators and coil transducers, and more particularly to devices employing inductively coupled coil transducers to transmit and receive data and/or power signals across a dielectric or isolation barrier.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required.

Prior art magnetic devices typically achieve high voltage isolation by employing opposing inductively-coupled coils, usually require high power levels (especially when high data rates are required), typically require the use of at least three separate integrated circuits or chips, and often are susceptible to electromagnetic interference ("EMI").

Prior art capacitive devices achieve voltage isolation by employing multiple pairs of transmitting and receiving electrodes, where for example a first pair of electrodes is employed to transmit and receive data, and a second pair of electrodes is employed to refresh or maintain the transmitted signals. Such capacitive devices typically exhibit poor high voltage hold-off or breakdown characteristics The design of small high speed galvanic isolators presents several formidable technical challenges, such as how to handle electromagnetic interference (EMI), large-magnitude fast transients, and other forms of electrical noise while maintaining high voltage breakdown characteristics, and acceptable data or power transfer rates.

What is needed is a high voltage isolation communication device that is small, consumes reduced power, permits data to be communicated at relatively high data rates, has improved high voltage breakdown capabilities, that may be built at lower cost, or that has other advantages that will become apparent after having read and understood the specification and drawings hereof.

SUMMARY

In one embodiment, there is provided a coil transducer comprising a generally planar electrically insulating substrate comprising opposing upper and lower surfaces, the substrate comprising an electrically insulating, non-metallic, non-semiconductor low dielectric loss material having a dielectric loss tangent at room temperature that is less than or equal to 0.05, a first electrical conductor forming a first coil, the first coil being disposed upon, in or near the upper surface, and a second electrical conductor forming a second coil, the second coil being disposed upon, in or near the lower surface, where the first coil is separated from the second coil by at least portions of the substrate, the first and second coils are spatially arranged and configured respecting one another such that at least one of power and data signals may be transmitted by the first coil to the second coil across a dielectric barrier comprising the non-semiconductor low dielectric loss material disposed therebetween, the dielectric barrier exceeds about 1 mil in thickness, and a breakdown voltage between the first coil and the second coil exceeds about 2,000 volts RMS.

In another embodiment, there is provided a coil transducer comprising a generally planar substrate comprising opposing upper and lower surfaces, the substrate comprising an electrically insulating, non-metallic, non-semiconductor, low dielectric loss material comprising one or more of fiberglass, glass, ceramic, polyimide, polyimide film, a polymer, an organic material, a flex circuit material, epoxy, epoxy resin, a printed circuit board material, PTFE and glass, PTFE and ceramic, PTFE, glass and ceramic, plastic and thermoset plastic, a first electrical conductor forming a first coil, the first coil being disposed upon, in or near the upper surface, and a second electrical conductor forming a second coil, the second coil being disposed upon, in or near the lower surface, where the first coil is separated from the second coil by at least portions of the substrate, the first and second coils are spatially arranged and configured respecting one another such that at least one of power and data signals may be transmitted by the first coil to the second coil across a dielectric barrier comprising the non-semiconductor low dielectric loss material disposed therebetween, the dielectric barrier exceeds about 1 mil in thickness, and a breakdown voltage between the first coil and the second coil exceeds about 2,000 volts RMS.

In still another embodiment, there is provided a method of making a coil transducer comprising providing a generally planar electrically insulating substrate comprising opposing upper and lower surfaces, the substrate comprising an electrically insulating, non-metallic, non-semiconductor low dielectric loss material having a dielectric loss tangent at room temperature that is less than or equal to 0.05, providing a first electrical conductor forming a first coil, the first coil being disposed on the upper surface, providing a second electrical conductor forming a second coil, the second coil being disposed on the lower surface, and configuring the first coil, second coil and the substrate in respect of one another such that the first coil is separated from the second coil by at least portions of the substrate, the first and second coils are spatially arranged and configured respecting one another such that at least one of power and data signals may be transmitted by the first coil to the second coil across a dielectric barrier comprising the non-semiconductor low dielectric loss material disposed therebetween, and a breakdown voltage between the first coil and the second coil exceeds about 2,000 volts RMS.

In yet another embodiment, there is provided a method of making a coil transducer comprising providing a generally planar substrate comprising opposing upper and lower surfaces, the substrate comprising an electrically insulating, non-metallic, non-semiconductor, low dielectric loss material comprising one or more of fiberglass, glass, ceramic, polyimide, polyimide film, a polymer, an organic material, a flex circuit material, epoxy, epoxy resin, a printed circuit board material, PTFE and glass, PTFE and ceramic, PTFE, glass and ceramic, plastic and thermoset plastic, providing a first electrical conductor forming a first coil, the first coil being disposed on the upper surface, providing a second electrical conductor forming a second coil, the second coil being disposed on the lower surface, and configuring the first coil, second coil and the substrate in respect of one another such that the first coil is separated from the second coil by at least portions of the substrate, the first and second coils are spatially arranged and configured respecting one another such that at least one of power and data signals may be transmitted by the first coil to the second coil across a dielectric barrier comprising the non-semiconductor low dielectric loss material disposed therebetween, and a breakdown voltage between the first coil and the second coil exceeds about 2,000 volts RMS.

In a further embodiment, there is provided a galvanic isolator comprising a generally planar electrically insulating substrate comprising opposing surfaces, the substrate comprising an electrically insulating, non-semiconductor, low dielectric loss material and having a first transmitter coil disposed on the upper surface and a second receiving coil disposed on the lower surface, a transmitter circuit operably connected to the first transmitter coil and configured to receive an input signal provided to the isolator, and a receiver circuit operably connected to the second receiving coil, where the transmitter circuit further comprises a pulse generation circuit configured to generate an output pulse at an output thereof corresponding to a transition in the input signal.

In yet a further embodiment, there is provided a galvanic isolator comprising a generally planar electrically insulating substrate comprising opposing surfaces, the substrate comprising an electrically insulating, non-semiconductor, low dielectric loss material and having a first transmitter coil disposed on the upper surface and a second receiving coil disposed on the lower surface a transmitter circuit operably connected to the first transmitter coil and comprising at least one output, a receiver circuit operably connected to the second receiving coil and comprising at least one input, and at least one common mode rejection (CMR) circuit operably connected to the output of the transmitter circuit or the input of the receiver circuit, the CMR circuit comprising a two-stage common mode amplifier circuit operably connected to a low impedance matched resistor divider network, the common mode amplifier circuit being configured to drive a center tap of the resistor divider network to a common mode reference voltage of the transmitter output or the receiver input, the common mode amplifier circuit further comprising a first folded cascode structure stage and a second output stage, the output stage comprising a PMOS output device having a first gate drive and an NMOS output device paired therewith and having a second gate drive, the output stage further comprising means for controlling a voltage difference between the first and second gate drives such that the voltage difference controlling means is configured to turn off when a first voltage at the first gate drive is lower than $v_p$ or when a second voltage at the second gate drive is higher than $v_n$.

In still a further embodiment, there is provided a galvanic isolator comprising a generally planar electrically insulating substrate comprising opposing surfaces, the substrate comprising an electrically insulating, non-semiconductor, low dielectric loss material and having a first transmitter coil disposed on the upper surface and a second receiving coil disposed on the lower surface, a transmitter circuit operably connected to the first transmitter coil and comprising at least one output, a receiver circuit operably connected to the second receiving coil and comprising at least one input, and at least one common mode rejection (CMR) circuit operably connected to the output of the transmitter circuit or the input of the receiver circuit, the CMR circuit comprising a common mode amplifier circuit operably connected to a low impedance matched resistor divider network, the common mode amplifier circuit being configured to drive a center tap of the resistor divider network to a common mode reference voltage of the transmitter output or the receiver input, each resistor in the resistor divider network having an impedance less than or equal to 100 ohms.

In a still further embodiment, there is provided a galvanic isolator, comprising a generally planar electrically insulating substrate comprising opposing surfaces, the substrate comprising an electrically insulating, non-semiconductor, low dielectric loss material and having a first transmitter coil disposed on the upper surface and a second receiving coil disposed on the lower surface, a transmitter circuit operably connected to the first transmitter coil and comprising at least one output, and a receiver circuit operably connected to the second receiving coil and comprising at least one input, a fully differential input stage circuit operably connected to the input, a fully differential comparator circuit operably connected to the input stage circuit, and a decoder circuit operably connected to the comparator circuit, the receiver circuit being configured to sense a positive output pulse followed by a negative output pulse when a rising edge of an input signal is provided to an input of the transmitter circuit.

In yet a further embodiment, there is provided a galvanic isolator, comprising a generally planar electrically insulating substrate comprising opposing surfaces, the substrate comprising an electrically insulating, non-semiconductor, low dielectric loss material and having a first transmitter coil disposed on the upper surface and a second receiving coil disposed on the lower surface, a transmitter circuit operably connected to the first transmitter coil and comprising at least one output, and a receiver circuit operably connected to the second receiving coil and comprising at least one input, a fully differential input stage circuit operably connected to the input, a fully differential comparator circuit operably connected to the input stage circuit, and a decoder circuit operably connected to the comparator circuit, the receiver circuit being configured to sense a negative output pulse followed by a positive output pulse when a rising edge of an input signal is provided to an input of the transmitter circuit.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

Figure 1:
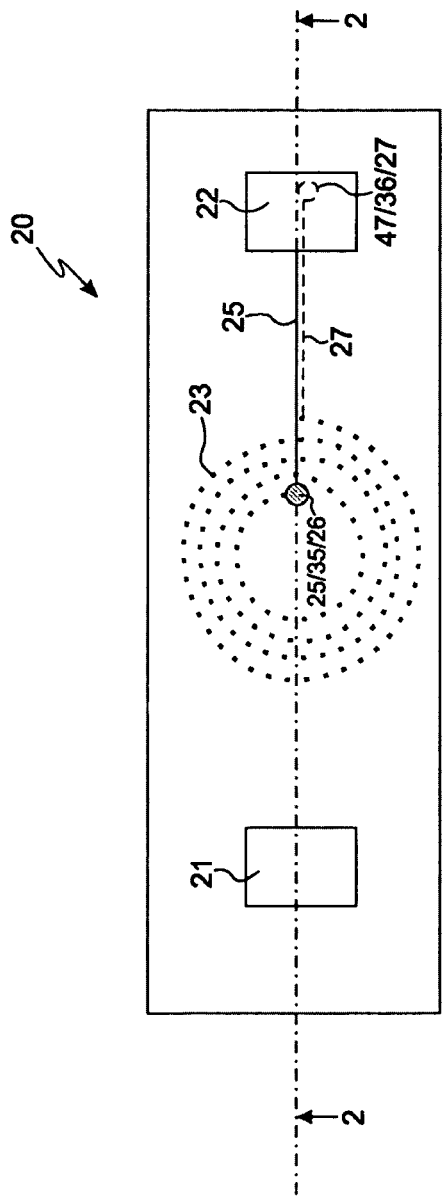
FIGS. 1 and 2 illustrate a galvanic isolator according to one embodiment of the invention.

In the following description, specific details are provided to impart a thorough understanding of the various embodiments of the invention. Upon having read and understood the specification, claims and drawings hereof, however, those skilled in the art will understand that some embodiments of the invention may be practiced without hewing to some of the specific details set forth herein. Moreover, to avoid obscuring the invention, some well known circuits, materials and methods finding application in the invention are not disclosed in detail herein.

In the drawings, some, but not all, possible embodiments of the invention are illustrated, and further may not be shown to scale.

The term "horizontal" as used herein is defined as a plane substantially parallel to the conventional plane or surface of the substrate of the invention, regardless of its actual orientation in space. The term "vertical refers to a direction substantially perpendicular to the horizontal as defined above. Terms such as "on,", "above," "below," "bottom," "top," "side," "sidewall," "higher," "lower," "upper," "over" and "under" are defined in respect of the horizontal plane discussed above.

Figure 2:
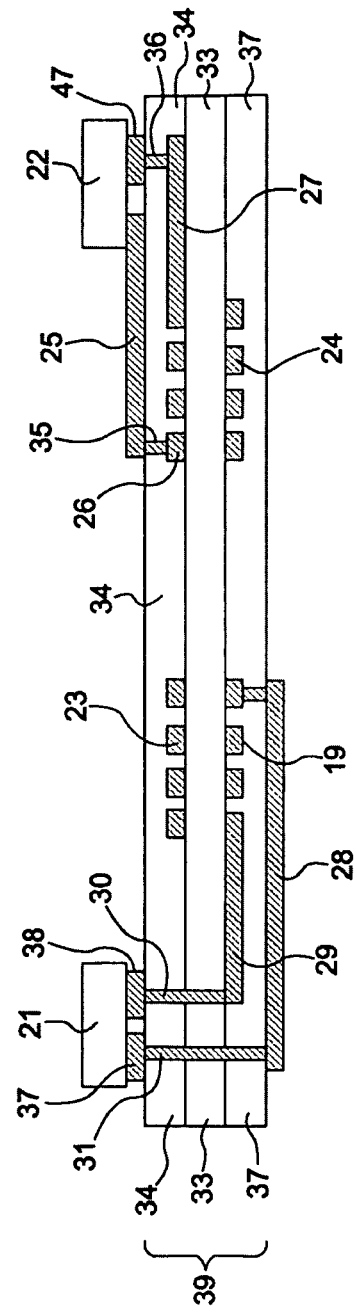

In combination with substrate 33 and coil transducer 39, coils 23 and 24 form a high voltage isolation data signal transfer or power transformer device. As shown in FIG. 2, coil 23 is separated from coil 24 by at least portions of substrate 33, and coil 23 and coil 24 are spatially arranged and configured respecting one another such that at least one of power and data signals may be transmitted by coil 23 to coil 24 across a gap or dielectric barrier comprising electrically insulating, non-metallic, non-semiconductor, low dielectric loss material disposed therebetween, and from which at least portions of substrate 33 are formed. In one embodiment, such a dielectric barrier comprises coil transducer 39, which includes substrate 33 and electrically insulating layers 34 and 37 disposed atop and below substrate 33. Input or transmitter circuit 21 is operably connected to first transmitting coil 23 and output or receiver circuit 22 is operably connected to second receiving coil 24.

Coil transducer 39 and substrate 33 disposed therewithin may comprise any of a number of different non-metallic, non-semiconductor, low dielectric loss materials, more about which is said below. In a preferred embodiment, coil transducer 39 and substrate 33 are capable of withstanding several kilovolts of potential difference between the input and output sides of isolator 20, and thus exhibit high voltage breakdown performance characteristics.

Transmitter circuit 21 changes an incoming signal waveform into a signal having a waveform suitable for driving primary transmitting coil 23. Receiver circuit 22 is configured to change the signal exiting secondary receiver coil 24 back into a waveform that looks like the incoming signal. Transmitter circuit 21, receiver circuit 22, and coil transducer 39 are preferably packaged in a format compatible with standard electronics assembly processes, such as printed circuit board assembly techniques. In some embodiments, packaging comprises mounting the various components of galvanic isolator 20 on a lead frame, wirebonding the components together, and surrounding them with a molding material to hold everything together after sacrificial metal leads have been separated from the lead frame and formed into standard integrated circuit leads. In magnetic transducers, design of the leadframe is important to avoid degrading the performance of galvanic isolator 20.

As shown in FIGS. 1 and 2, galvanic isolator 20 comprises transmitter circuit 21 and receiver circuit 22, which in one embodiment comprise coils 23 and 24 disposed on opposing top and bottom sides of substrate 33. In another embodiment, coils 23 and 24 are disposed on the same side of substrate 33.

In the embodiment illustrated in FIGS. 1 and 2, circuits 21 and 22 are connected to bond pads 37, 38 and 47 on the top surface of layer 34. Alternatively, transmitter circuit 21 and receiver circuit 22 may be attached to a lead frame and connected by wire bonds to bond pads attached to coils 23 and 24. Other packaging embodiments are also contemplated. In one embodiment, coils 23 and 24 are fabricated by lithographically patterning metal layers on the surface of substrate 33, although many other means of forming coils 23 and 24 are contemplated, such as placing such coils on different layers or substrates and then laminating the substrates or layers together. Alternatively, an electrically insulating, non-metallic, non-semiconductor, low dielectric loss layer or substrate may be disposed below coils 23 and 24. Note that in preferred embodiments transmitter circuit 21 and receiver circuit 22 are integrated circuits or chips.

Substrate 33 and/or coil transducer 39 are formed of an appropriate electrically insulating, non-metallic, non-semiconductor, low dielectric loss materials. In one embodiment, a suitable such material has a dielectric loss tangent at room temperature that is less than about 0.05, less than about 0.01, less than about 0.001 or less than about 0.0001. Even though the material employed to form substrate 33 of the invention is a non-semiconductor material, we define dielectric loss tangent values associated therewith herein to permit comparison of the novel substrate material of the invention to known semiconductor materials. Further information regarding dielectric loss tangents and the intrinsic and extrinsic losses associated therewith is set forth in "Loss Characteristics of Silicon Substrate with Different Resistivities" to Yang et al., pp. 1773-76, vol. 48, No. 9, September 2006, Microwave and Optical Technology Letters. Yang et al. discuss theoretically and experimentally dividing dielectric losses into an intrinsic loss tangent of silicon and an extrinsic loss associated with substrate leakage losses, and demonstrate that as doping levels in silicon increase, extrinsic losses also increase.

Some examples of suitable materials for forming substrate 33 and/or coil transducer 39 also include, but are not limited to, one or more of printed circuit board material, FR4 and other printed circuit board materials, fiberglass, glass, ceramic, polyimide, polyimide film, a polymer, an organic material, a combination of an organic filler such as epoxy and an inorganic solid such as glass, a flex circuit material, epoxy, epoxy resin, a printed circuit board material, plastic, DUPONT™ KAPTON™, DUPONT™ PYRALUX AB™ laminate, and a ROGERS™ material (e.g., PTFE—or polytetrafluoroethylene—and glass, PTFE and ceramic, PTFE, glass and ceramic, or thermoset plastic). The particular choice of the material from which substrate 33 is formed will, in general, depend on cost, the degree or amount of electrical isolation or voltage breakdown protection that is desired, the particular application at hand, and other factors or considerations. For example, glass and ceramic substrates are well suited for applications involving high voltages; to reduce manufacturing and processing costs, flex circuit substrates may be employed.

In a preferred embodiment, substrate 33 has sufficient thickness between the upper and lower horizontal surfaces thereof, and electrical insulation characteristics appropriate, to withstand the relatively high breakdown voltages for which galvanic isolator 20 and coil transducer 39 may be designed. By way of example, in one embodiment a breakdown voltage between coil 23 and coil 24 exceeds about 2,000 volts RMS when applied over a time period of about one minute. In other embodiments, the breakdown voltage between coil 23 and coil 24 exceeds about 2,000 volts RMS when applied over six minutes or over 24 hours. In other embodiments, even higher breakdown voltages can be withstood by coil transducer 39, substrate 33 and galvanic isolator 20, such as about 2,500 volts RMS, about 3,000 volts RMS, about 4,000 volts RMS and about 5,000 volts RMS for periods of time of about 1 minute, 6 minutes and/or 24 hours.

In some embodiments, substrate 33 and/or coil transducer 39 has a thickness between the upper and lower horizontal surfaces thereof ranging between about 0.5 mils and about 10 mils, or between about 0.5 mils and about 25 mils. In one embodiment, the thickness of substrate 33 and/or coil transducer 39 exceeds about 1.5 mils. In another embodiment, substrate 33 and/or coil transducer 39 comprises a plurality of layers, where at least one of the layers comprises a low dielectric loss material. As will be seen by referring to the Figures hereof, coil transducer 39 is generally thicker than substrate 33. For example, in one embodiment, coil transducer 39 is 19 mils thick, while substrate 33 disposed therein is 10 mils thick.

Continuing to refer to FIGS. 1 and 2, each of coils 23 and 24 has an outer end and an inner end. Each of these ends is connected to an appropriate terminal on the transmitter or receiver circuit associated therewith. In one embodiment, and in respect of each coil, a first electrical connection is established using a first trace formed with a first coil when the metal layer from which the first coil is patterned is etched, and a second electrical connection is established with the first coil using a patterned metal layer on an outer surface of coil transducer 39. For example, an electrical connection to inner end 26 of coil 23 is established through trace 25 disposed on the top surface of electrically insulating layer 34 and through vertical via 35 to underlying conductor 26 (from which coil 23 is formed). Similarly, an electrical connection to an outer end of coil 23 is established through trace 27 disposed within electrically insulating layer 34 and through vertical via 36 to overlying bond pad 47. An electrical connection to an outer end of coil 23 is made through trace 27, which may be patterned from the same layer as coil 23. Trace 27 is connected electrically to circuit 22 by via 36 disposed through layer 34. Circuit 21 is electrically connected to the outer end of coil 24 by trace 29 and via 30. Trace 29 may be patterned from the same metal layer as coil 24. An inner end of coil 24 is electrically connected to circuit 21 by trace 28 disposed on the bottom surface of electrically insulating layer 37 through via 31. Insulating layers may be added atop or below the layers of metal, and may encapsulate or have disposed therewithin traces 25 and 28 so as to prevent electrical contact from being established between traces 25 and 28 and any external electrical conductors or surfaces that might otherwise come into contact with traces 25 and 28.

To facilitate the use of wire bonding techniques in the manufacture of galvanic isolator 20 or coil transducer 39, the structures shown in FIGS. 1 and 2 may be simplified to form two different metal layers disposed on a single substrate 33. In such an embodiment, coil transducer 39 may be constructed from two metal layers that are deposited and patterned on opposing sides of substrate 33. For example, the top metal layer may be patterned to provide coil 23 and the various connection pads utilized by transmitter circuit 21 and receiver circuit 22 on a top surface of substrate 33. The bottom metal layer may be used to fabricate coil 24, which underlies coil 23 and forms second coil of the transformer on a bottom surface of substrate 33. The bottom layer may also be patterned to provide traces that are used to connect coil 24 to wire bond pads disposed on the top surface of substrate 33 through vertical vias. Coil 23 may then be connected to transmitter circuit 21 by wire bonds, and coil 24 may be connected to receiver circuit 22 by a trace patterned from the top metal layer and by a wire bond. In preferred embodiment, wire bond pads are electroplated. The various connection pads for connecting coil transducer 39 to external circuits that are to be isolated by coil transducer 39 may also be patterned from the top metal layer.

In one embodiment, the structures illustrated in FIGS. 1 and 2 may be fabricated using a conventional printed circuit board fabrication line. As a result, the cost of manufacturing coil transducer 39 may be much less than that of a coil transducer constructed from silicon on a semiconductor fabrication line. In addition, silicon substrates are known electrical conductors or semi-conductors, and do not exhibit the low dielectric loss properties of the substrates and coil transducers of the invention. Embodiments of coil transducer 39 based on flexible organic/inorganic or organic substrates are particularly attractive. Printed circuit boards or circuit carriers are known in the art, and hence need not be discussed in detail here. It is worth noting, however, that substrates 33 and coil transducers 39 of the invention that are formed from printed circuit board materials do provide an excellent low-cost alternative to silicon-based materials. Printed circuit board materials are less expensive, easier to handle, and more amenable to quick design or manufacturing changes than silicon-based materials. For purposes of the present discussion it is sufficient to note that printed circuit boards may be fabricated by depositing a thin metal layer, or attaching a thin metal layer, on a somewhat flexible organic/inorganic substrate formed of fiberglass impregnated with epoxy resin and then converting the layer into a plurality of individual conductors using conventional photolithographic techniques. Additional metal layers may be added atop the thin metal layer after an intervening electrically insulating layer or coating has been laid down on the thin metal layer.

Flex circuit technology may also be employed to form substrate 33 and/or coil transducer 39 of galvanic isolator 20, where substrate 33 and/or coil transducer 39 are made of an organic material such as polyimide. Films and laminates of this type are available commercially from DUPONT™ and utilize substrate materials known as KAPTON™ made from polyimide. In some cases, a plurality of polyimide layers may be laminated with an adhesive to form substrate 33 and/or coil transducer 39. This type of circuit carrier or printed circuit board is significantly less expensive than conventional silicon semiconductor material based approaches and can be employed to provide substrate 33 and/or coil transducer 39 having a high breakdown voltage and other desirable high voltage isolation characteristics. Thinner substrates 33 and/or coil transducers 39 are preferred in applications where signal losses between primary and secondary coils 23 and 24 must be minimized. For example, in one embodiment of substrate 33 and/or coil transducer 39, a PYRALUX AP™ laminate manufactured by DUPONT™ is employed to form a 2 mil thick KAPTON™ substrate 33, and electrically conductive copper layers and traces are added to the top and bottom surfaces thereof.

Note that coils 23 and 24 may assume any of a number of different structural configurations and nevertheless fall within the scope of the invention. For example, coils 23 and 24 may assume the circular or oval spirally-wound shapes illustrated in FIGS. 1 and 2, or may assume myriad other shapes such as rectangularly, squarely, triangularly, pentagonally, hexagonally, heptagonally or octagonally-wound shapes arranged in a horizontal plane, conductors arranged to interleave with one another within a horizontal plane, one or more serpentine conductors arranged in a horizontal plane, and so on. Any suitable structural configuration of coils 23 and 24 is permitted so long as the magnetic fields projected by one coil may be received and sufficiently well detected by the other opposing coil.

Figure 3:
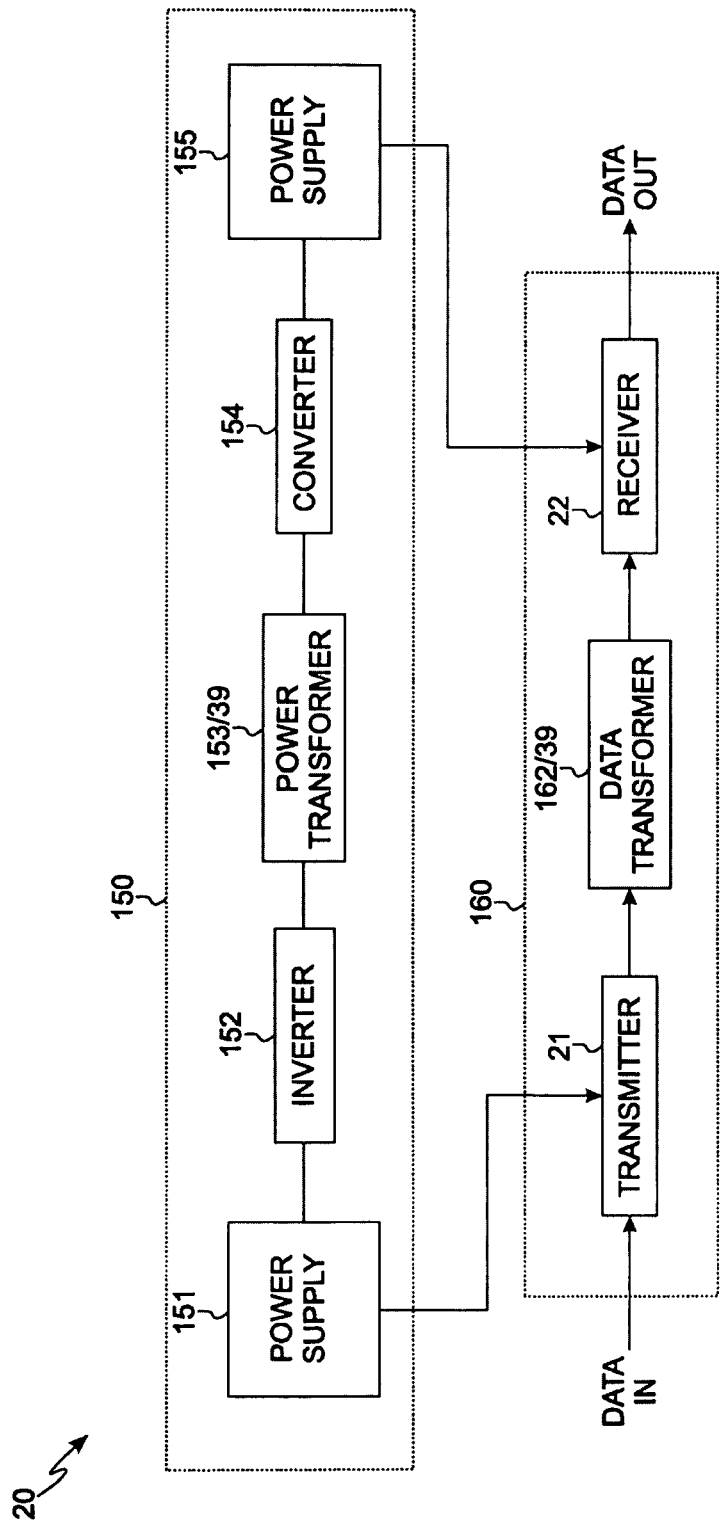
FIG. 3 illustrates a block diagram of galvanic isolator 20 comprising power and data transformers according to one embodiment of the invention.

In some embodiments, galvanic isolator 20 may comprise transformers in which the electronic and electrical components on one side of substrate or isolation barrier 33 are powered by a power source disposed on the opposing side of substrate 33. Referring now to FIG. 3, there is shown galvanic isolator 20 comprising power section 150 and data transfer section 160. Data transfer section 160 includes an isolation gap that blocks transients and/or performs voltage shifts between the circuitry disposed on the transmitter side of the isolation gap and the circuitry disposed on the receiver side of the isolation gap. Galvanic isolator 20 utilizes two transformers. Transformer 162 provides an isolation barrier for the transfer of data between transmitter 21 and receiver 22. Transformer 153 is used to transfer power from power supply 151 disposed on the transmitter side of the isolation gap to power supply 155 disposed on the receiver side of the isolation gap.

Power section 150 includes optional power supply 151 configured to power circuitry on both sides of the isolation gap. Inverter 152 generates an AC or oscillatory power signal from the DC power provided by power supply 151. The AC or oscillatory power signal is transferred to the receiver side of the isolation gap by a power transformer 153. The output of the secondary winding of power transformer 153 is rectified by converter 154 to provide isolated power supply 155 that is used to power receiver 22. The DC potentials provided by power supplies 151 and 155 may be the same or different, depending on the particular galvanic isolator design and application at hand. One advantage of various embodiments of the invention is that power may be safely and conveniently provided across substrate 33 and/or coil transducer 39, and thus is well adapted for medical applications and other applications where electrically isolated power may be difficult or costly to provide. Power transformer 153 can provide a voltage step up or step down to facilitate the generation of the different output voltages. Alternatively, power may also be derived from a train of pulses applied to power transformer 153 from a source external to galvanic isolator 20.

It will now become apparent that various embodiments of galvanic isolator 20, coil transducer 39, and substrate 33 may be configured as high voltage isolation data transfer devices, power transformers, or both. Note further that the term "transformer" or "transducer" as employed herein means a device capable of transmitting and receiving power or data signals, or power and data signals, across a gap or dielectric barrier formed of an electrically insulating material.

Figure 4:
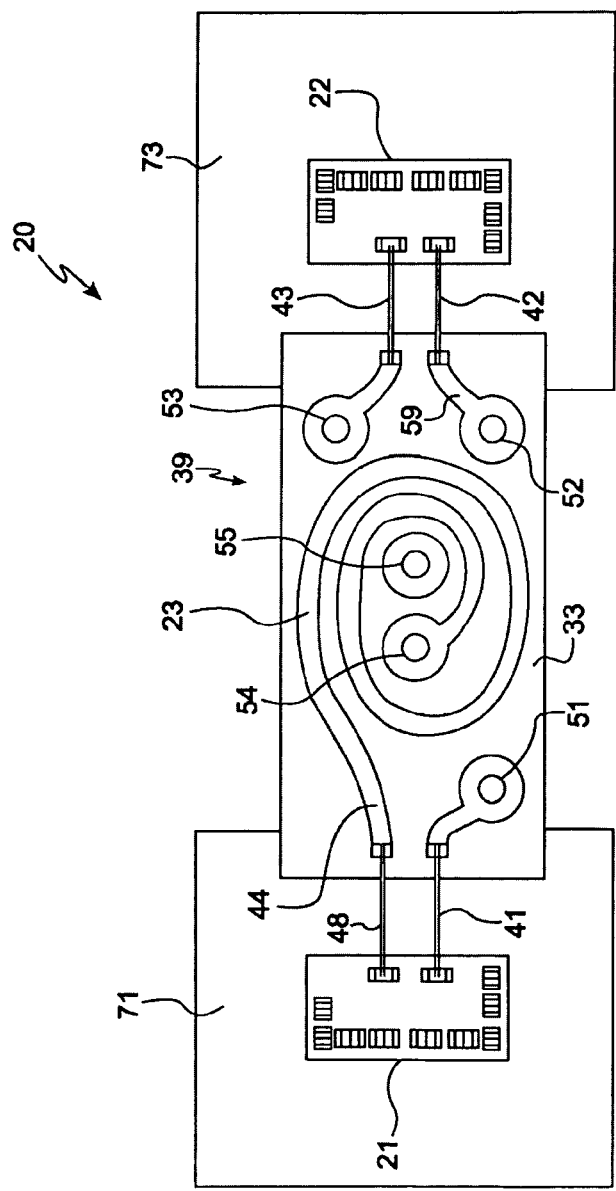
FIGS. 4 and 5 illustrate a galvanic isolator package according to one embodiment of the invention.
Figure 5:
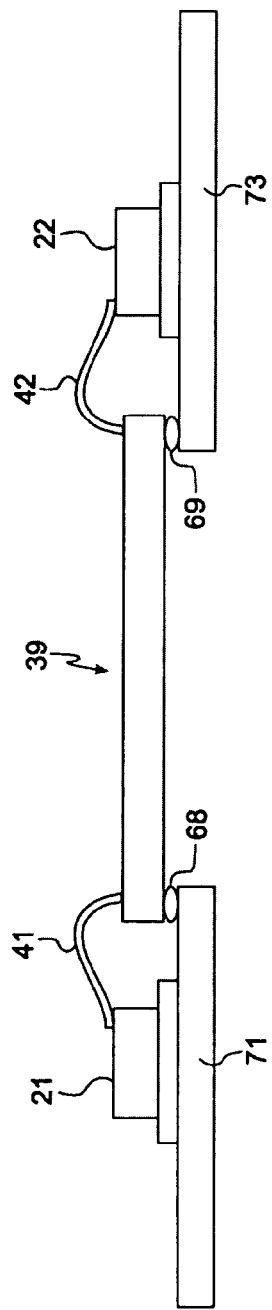

Referring now to FIGS. 4 and 5, there are shown top and side views of one embodiment of galvanic isolator 20, respectively, where input lead frame 71 and output lead frame 73 underlie and extend beneath portions of substrate 33 and coil transducer 39. Input lead frame 71 and output lead frame 73 are preferably connected to coil transducer 39 such that electrically conductive portions of input lead frame 71 and output lead frame 73 do not extend beneath substrate 33 and coil transducer 39 to locations disposed vertically directly beneath transmitter coil 23 or receiver coil 24.

Figure 6:
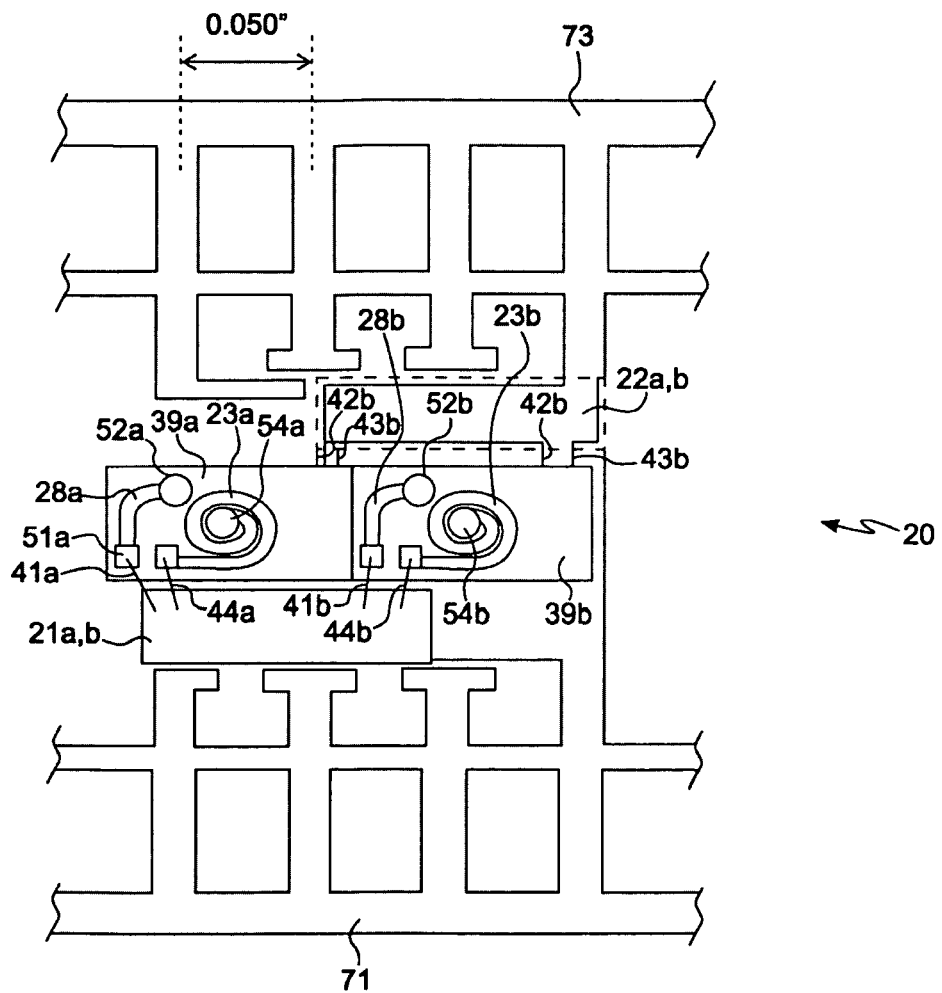
FIG. 6 illustrates another galvanic isolator package according to one embodiment of the invention.

In the embodiment illustrated in FIGS. 4 and 5, input lead frame 71 and output lead frame 73 are connected to coil transducer 39 such that input lead frame 71 and output lead frame 73 are mechanically connected to a lower side of coil transducer 39. In another embodiment, however, input lead frame 71 and output lead frame 73 are mechanically connected to opposing top and bottom sides, respectively, of coil transducer 39, such as is shown in FIG. 6.

If a metal layer is placed too close to the respective horizontal planes of coils 23 and 24, the magnetic field lines transmitted or sensed thereby will be disturbed and the efficiency (throughput $S_{21}$) will be decreased. Furthermore, input and output lead frames 71 and 73 must be adequately separated to prevent arcing from inadvertently electrically connecting transmitter circuit 21 to receiver circuit 22. Consequently, it is desirable to design lead frames 71 and 73 so that the input side of the lead frame extends just far enough underneath coil transducer 39 that the bondpads lie above the lead frame for easy wirebonding, but not so far beneath coil transducer 39 as to extend directly beneath portions of coils 23 and 24. Transmitter circuit or integrated circuit 21, or inverter 152, may then be mounted on the input side of leadframe 71 next to the input side of coil transducer 39, and receiver circuit or integrated circuit 22, or converter 154, may be mounted on the output side of leadframe 73 next to the output side of coil transducer 39.

Continuing to refer to FIGS. 4 and 5, it should be noted that the electrical potential difference between lead frames 71 and 73 and coil transducer 39 may be several kV; in some embodiments lead frames 71 and 73 may be held at or near electrical ground. Mounting of integrated circuits 21 and 22 on lead frames 71 and 73 can be effected with epoxy 68 and 69. Epoxy 68 and 69 are preferably electrically non-conductive to reduce the possibility of unwanted short circuits being created through the epoxy. Transmitter circuit 21 is preferably wirebonded to the input side of coil transducer 39 though wirebonds 41 and 48. Receiver circuit 22 is preferably wirebonded to the output side of coil transducer 39 through wirebonds 42 and 43.

As described above, substrate 33 and/or coil transducer 39 are preferably fabricated to have a thickness between their respective upper and lower surfaces sufficient to prevent high voltage arcing. One advantage of the materials employed to form substrate 33 and/or coil transducer 39 of the invention is that substrate 33 and/or coil transducer 39 may be substantially thicker than is generally possible or financially feasible in commercial applications which employ conventional semiconductor materials and manufacturing processes. For example, substrate 33 and/or coil transducer 39 may have thicknesses ranging between about 1 mil and about 25 mils, between about 1.5 mils and about 25 mils, or between about 2 mils and about 25 mils. Polyimide processes compatible with silicon IC processes are typically much thinner and cannot withstand voltages nearly as high as those capable of being withstood by some embodiments of substrate 33 and/or coil transducer 39. The high distance-through-insulation (DTI) values characteristic of some embodiments of substrate 33 and coil transducer 39 provide a desirable performance metric in many electrical isolator applications and easily meet most certification requirements issued by relevant standards organizations. Conversely, substrate 33 and/or coil transducer 39 may also be made quite thin, e.g., 0.5 mils or less, and yet still provide relatively high voltage breakdown performance characteristics.

Note further that substrate 33 and/or coil transducer 39 of the invention may be formed using any of a number of different manufacturing processes and electrically insulating, non-metallic, non-semiconductor, low dielectric loss materials described above. These processes and materials are amenable to processing electrically insulating materials in bulk and do not require the expensive and elaborate procedures required to handle semiconductor materials such as silicon. Moreover, substrate 33 and coil transducer 39 of the invention provide superior high voltage breakdown performance characteristics respecting silicon-based devices owing to their increased distances-through-insulation (more about which is said above). Because substrate 33 and coil transducer 39 of the invention exhibit substantially increased distances-though-insulation and thicknesses respecting prior art galvanic isolators having silicon substrates (which were generally limited to thicknesses of less than 1 mil), substrate 33 may be configured to impart substantial mechanical rigidity and strength to coil transducer 39 and galvanic isolator 20. Unlike the relatively fragile and thin silicon substrates of the prior art, substrate 33 and coil transducer 39 of the invention are mechanically robust and strong, may be mounted directly on lead frames, and may be handled without special care.

In addition, although in theory it might be possible to manufacture a substrate or coil transducer from semiconductor material upon opposing surfaces upon which conductors could be formed using metalized layers, such constructions are rarely (if at all) seen in practice owing to the general delicacy of the substrates formed using semiconductor materials. As a result, substrates or coil transducers formed from semiconductor materials are typically handled in a manner that requires metalized or other layers be formed on one side only of such substrates. Contrariwise, in substrate 33 and/or coil transducer 39 of the invention, both sides of substrate 33 and/or coil transducer 39 may easily have coils or other components formed or mounted thereon owing to the radically different nature of the manufacturing processes used, and the materials employed, to form substrate 33 and/or coil transducer 39.

Continuing to refer to FIGS. 4 and 5, note that several channels may be accommodated in a single package by stacking channels side by side along the long dimension of a package such as an SO-16 widebody so that all channels share the same input lead frame and ground, and so that all channels share the same output lead frame and ground.

Referring now to FIG. 6, there is shown a flip lead frame arrangement for dual galvanic isolator 20. Each of integrated circuits 21 and 22 contains two channels. This design provides two channels rather than the single channel configuration illustrated in FIGS. 4 and 5. Lead frames 71 and 73 are designed to permit a flip, as is the case in many opto-isolator lead frames finding common use today. First, integrated circuit 22a,b and the nearby ends of coil transducers 39a and 39b are attached to corresponding respective portions of lead frame 73 and wirebonded thereto. Integrated circuit 21a,b is attached to lead frame 71. Then lead frame 73 is flipped over into the position shown in FIG. 6, the other ends of coil transducer 39a and 39b are attached to corresponding sides of lead frame 71, and finally wirebonded together. Those skilled in the art will understand that many other configurations are possible. For example, dual-channel devices may be configured to have separate transmitter circuit chips 21 and receiver circuit chips 22 for each channel.

Figure 7:
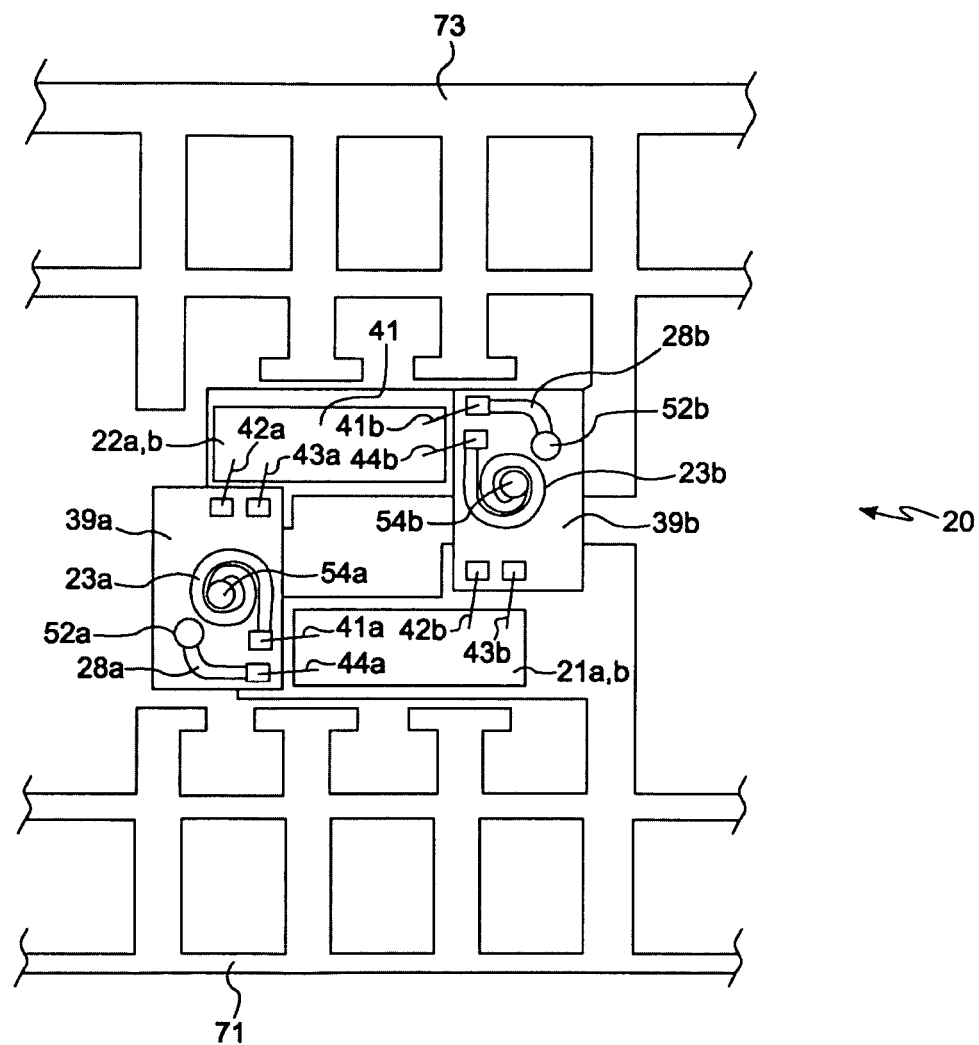
FIG. 7 illustrates still another galvanic isolator package according to one embodiment of the invention.

FIG. 7 shows another embodiment of a package of the invention, also configured for two channels. The embodiment illustrated in FIG. 7 is a small format package design that includes two coil transducers 39a and 39b, a dual-channel transmitter IC 21 a,b, and a dual-channel receiver IC 22 a,b.

Even if substrate 33 and/or coil transducer 39 have good internal high voltage breakdown performance characteristics, isolator 20 based on such substrate 33 and/or coil transducer 39 may not exhibit good high voltage breakdown performance characteristics unless all potential arcing paths within isolator 20 have been eliminated or blocked. To reduce the chances of arcing, a thick overlay is preferably employed in a package. No voids should be present between the layers of galvanic isolator 20 and/or coil transducer 39, or between the various components of isolator 20 and the overlay. The adhesion between the different layers of coil transducer 39 should remain strong during die separation, so that no delamination results. It is good practice to locate the bus bars for electroplating together near the appropriate wirebond pads in order to avoid busbar-to-busbar conduction along the sides of coil transducer 39.

In opto-isolators, the space between the LED and the receiver containing a photodetector is typically filled with an optically transparent insulating material such as silicone. In magnetic induction galvanic isolators, while optical transparency is not required, silicone may still be employed advantageously. Silicone is a considerably better electrical insulator than air and also adheres well to many other materials, and therefore may be used advantageously to inhibit the formation of air gaps between different parts of galvanic isolator 20 and/or coil transducer 39 during thermal cycling. Furthermore, silicone has low dielectric loss characteristics and thus does not disturb the operation of coils 23 and 24. In a preferred embodiment, silicone is therefore emplaced around at least portions of coil transducer 39 and/or galvanic isolator 20 to enhance the electrical isolation characteristics of isolator 20. While this step may be omitted to reduce costs, performance may also be compromised if silicone is not used.

Galvanic isolator 20 and/or coil transducer 39 are preferably overmolded. In one embodiment, lead frame 71, coil transducer 39, and lead frame 73 are attached to one another, wirebonded, and placed in a mold. A melted appropriate electrically insulating molding material such as epoxy is forced into the mold to encapsulate at least portions of the package. The molding material is then allowed to cool and harden, thereby imparting substantial additional structural rigidity to the resulting package. The molding material preferably has an appropriate dielectric constant and low dielectric loss such that the electrical performance of galvanic isolator 20 is not degraded. The leads are then trimmed and bent.

The packaging examples described and shown herein are not meant to cover all possibilities for packaging galvanic isolator 20 of the invention, and many different variations and permutations are contemplated.

The various embodiments of galvanic isolators 20 configured for isolated signal transfer disclosed herein are AC or oscillatory signal devices, which generally behave like differentiators in the manner in which they respond to transitions in incoming signals. To achieve the highest isolator efficiency it is desirable for the spectrum of the pulse driving the coil transducer to contain relatively high frequency components that optimize the transmission characteristics of the coil transducer. A straightforward way to generate high frequency components is to represent each transition by a short pulse. Because at least two types of transitions (turn-on and turn-off) are present in an incoming logic signal or input data pulse, it is necessary for the output of transmitter circuit 21 to include at least two different waveforms. Such functionality can be accomplished in various ways, including encoding, tri-level logic, and the like. Another important factor in transmitter circuit design is to quench signals reflected by the transducer. Power not transmitted through the coils will reflect back to the transmitter circuit, so a snubber circuit may be included therein to reduce or eliminate the reflected signal.

As discussed above, transmitter circuit 21 couples across coil transducer 39 and substrate 33 to receiver circuit 22 and an isolated output side of galvanic isolator 20. In one embodiment, the signal transmitted across substrate 33 and coil transducer 39 by transmitter circuit 21 looks rather like the first derivative or inverted first derivative of the output signal provided by transmitter circuit 21, depending on how connections are made to coils 23 and 24 and the structures of coils 23 and 24. Receiver circuit 22 must be capable of detecting accurately whether a transition in the input signal has occurred. Receiver circuit 22 also generally requires amplification to compensate for losses in coil transducer 39, unless coil transducer 39 and/or galvanic isolator 20 are designed to step up the output signal to compensate for internal losses.

Both transmitter circuit 21 and receiver circuit 22 are preferably designed to handle sudden shifts in voltage between the input and output sides of the galvanic isolator 20. Common mode rejection (CMR) capability enables galvanic isolator 20 to transmit signals accurately from the input to the output even in the presence of a sudden kilovolt-level shift between the input circuitry and the output circuitry. Imaginative designs are therefore required to meet CMR requirements, if they are to be met at all. According to some embodiments of the invention, a CMR circuit is configured to handle transient signals of at least 50 kV/microsecond.

Figure 8:
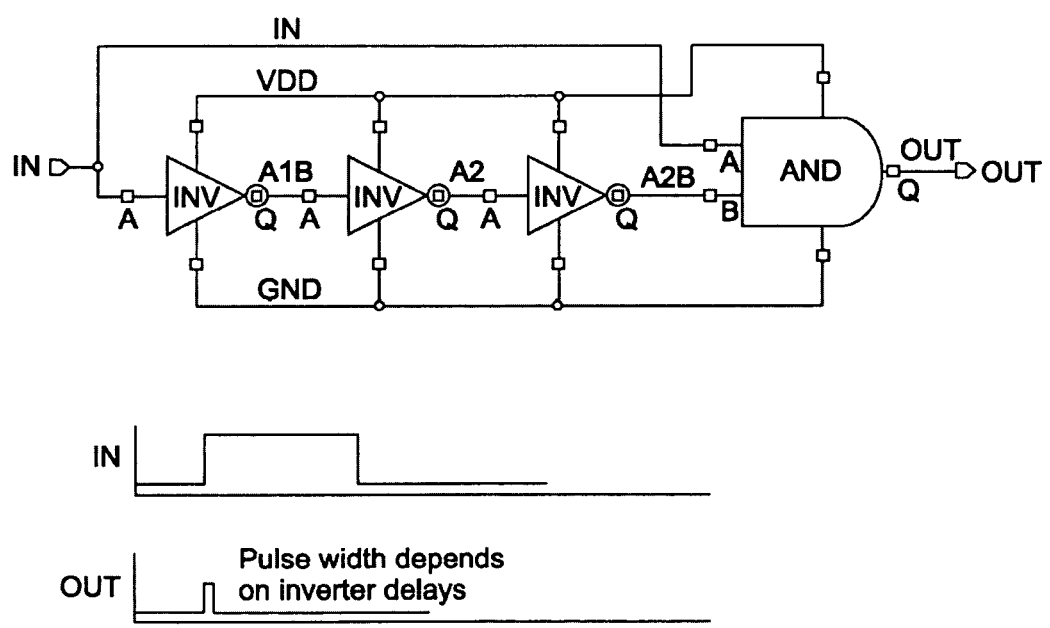
FIG. 8 shows a pulse generator circuit according to one embodiment of the invention.

Referring now to FIG. 8, in one embodiment for transmitting signals over a transformer isolation channel, positive-going short pulses are employed for positive transitions in an input signal and negative-going short pulses are employed for negative transitions in the input signal. (In another embodiment, the polarities of such transitions are reversed.) Such a method allows a high signal throughput rate for an isolation channel to be achieved without resorting to much more elaborate (and generally much more power-consuming) coding schemes. In such an embodiment, the timing information of an input signal is preserved since the positive and negative pulses are initiated by the input signal transitions. The differentiation of the signal by the coil transformer provides sequencing information. According to one embodiment, for a positive signal transition to be detected by receiver circuit 22, a positive pulse is followed by a negative pulse. At the downward-going transition of the input signal input there is a negative pulse followed by a positive pulse for the transmission of the signal. If this sequence is not followed for a positive-going input signal, the receiver cannot decode the signal. In one embodiment, short pulses are generated at signal transitions using a strobe generator circuit such as that illustrated in FIG. 8, where pulse width depends on inverter delays.

Similarly, if the AND element in FIG. 8 is replaced with a NOR element, a positive-going pulse may be generated at the negative-going transition of the input. Short negative going pulses at either of the signal transitions may be generated by other embodiments of strobe generator circuits. The resulting pulses are used to drive current source devices that provide current excitation to primary coil 23.

Figure 9:
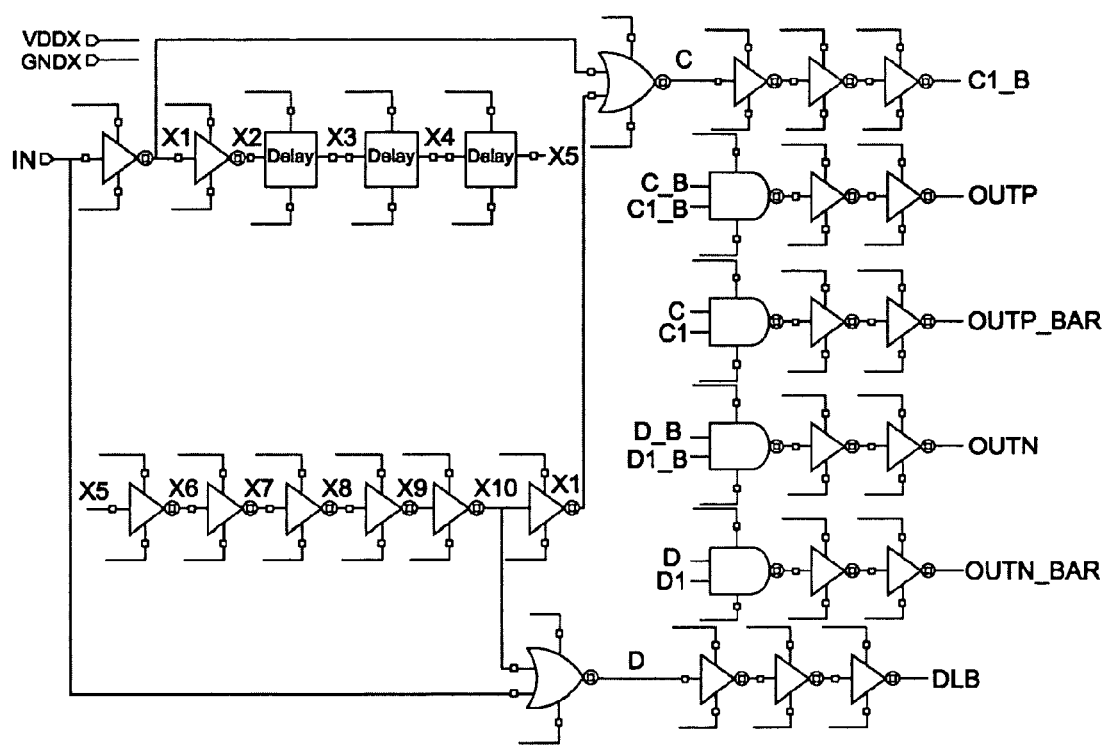
FIG. 9 illustrates further details of the pulse generator circuit of FIG. 8 according to one embodiment of the invention.

It is desirable to optimize the drive currents through coil primary 23 to maximize the magnetic field that is generated in the transformer. One embodiment of pulse generation circuits (of which strobe generator circuits are a subset) configured to provide drive currents for positive- and negative-going current pulses at both ends of primary coil 23 is shown in FIG. 9. The left side of the schematic in FIG. 9 shows pulse generation or strobe generator circuits for generating the positive and negative transitions corresponding to the input signal. The strobes are present at nodes C and D. The pulse width of the generated strobe signals may be changed by using different numbers of inverters in the strobe generators. The right side of the circuit shows driver circuits that gradually amplify the strobe signals and to drive the bridge circuit FETs illustrated in FIG. 10.

Figure 10:
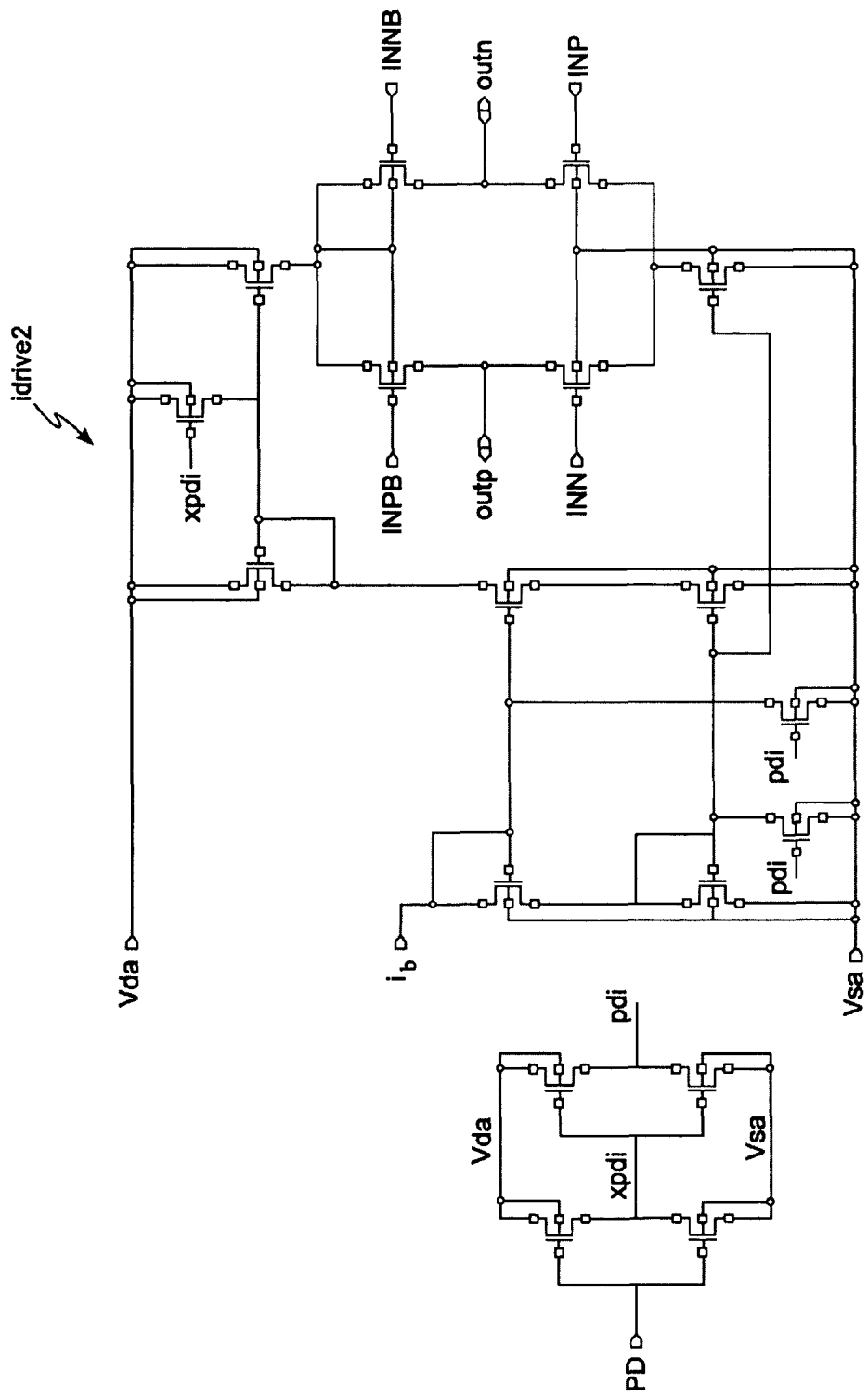
FIG. 10 shows a bridge circuit with current sources for driving both ends of a primary coil according to one embodiment of the invention.

FIG. 10 shows a drive mechanism employing a bridge circuit with current sources for driving both ends of primary coil 23. The current sources are controlled by a current mirror system so that smaller values of bias current can be used to control pulses having magnitudes of several milliamps that flow through the coil. This allows the current drive level to be changed by adjusting the current at node $i_b$. This implementation also provides a balanced drive for both current directions. The use of a relatively high current driver circuit to drive current through coil 23 may seem to be a contradiction for a system that where low power consumption is generally desired. The short pulse duration keeps the average current consumption low, however. This is a significant advantage of some embodiments of the invention relative to prior art technology employing optocouplers. The comparative power efficiency of this type of isolation channel at relatively low data rates is substantial. The transmitter section also requires common mode signal protection, more about which is said below.

Isolation circuitry allows different portions of galvanic isolator 20 and/or coil transducer 39 to operate at significantly different potentials that may arise, for example, because of DC voltage differences, power line voltage differences, or ground potential differences. As described above, high voltage isolation is required between coils 23 and 24 of galvanic isolator 20 and coil transducer 39, which is achieved with the use the materials described above to form substrate 33. One difficult aspect of common mode signals is the fast transients that arise between the grounds of transmitter circuit 21 and receiver circuit 22. An inherent capacitance exists between traces disposed on either side of substrate 33, and in particular between coils 23 and 24. This inherent capacitance includes capacitive coupling between the primary and secondary side of galvanic isolator/transformer 20.

Consider a capacitance between primary coil 23 and secondary coil 24 of about 1 pF. If a common mode transient between transmitter circuit 21 and receiver circuit 22 of 1 kV occurs with a slope of 50 kV/μsec, then the resulting current will be:

$$I = C \cdot dV/dt = 1 \text{ pF} \cdot 50 \text{ kV/μsec} = 50 \text{ mA} \quad \text{eq. (1)}$$

This current will flow over a duration of:

$$t = V_{step}/(dV/dt) = 1 \text{ kV}/(50 \text{ kV/μsec}) = 20 \text{ ns eq.} \quad (2)$$

The common mode design of galvanic isolator 20 is preferably configured to absorb a transient signal of such a magnitude over such a short period of time while maintaining proper signal transmission performance characteristics. Tradeoffs must be made between magnetic coupling through coil transducer 39 and the spacing between primary coil 23 and secondary coil 24. As a result, the CMR design for galvanic isolator 20 becomes particularly challenging.

To maintain a common mode voltage of the transmitter outputs as well as the receiver inputs so they remain well within the operating supply rails of the system, common mode current must be absorbed or supplied, depending on the direction of the common mode current flow due to the changing ground potential difference between the transmitter and the receiver. Common mode current compensation may be achieved by a common mode amplifier whose output is capable of handling the large amounts of common mode current that are generated.

Figure 11:
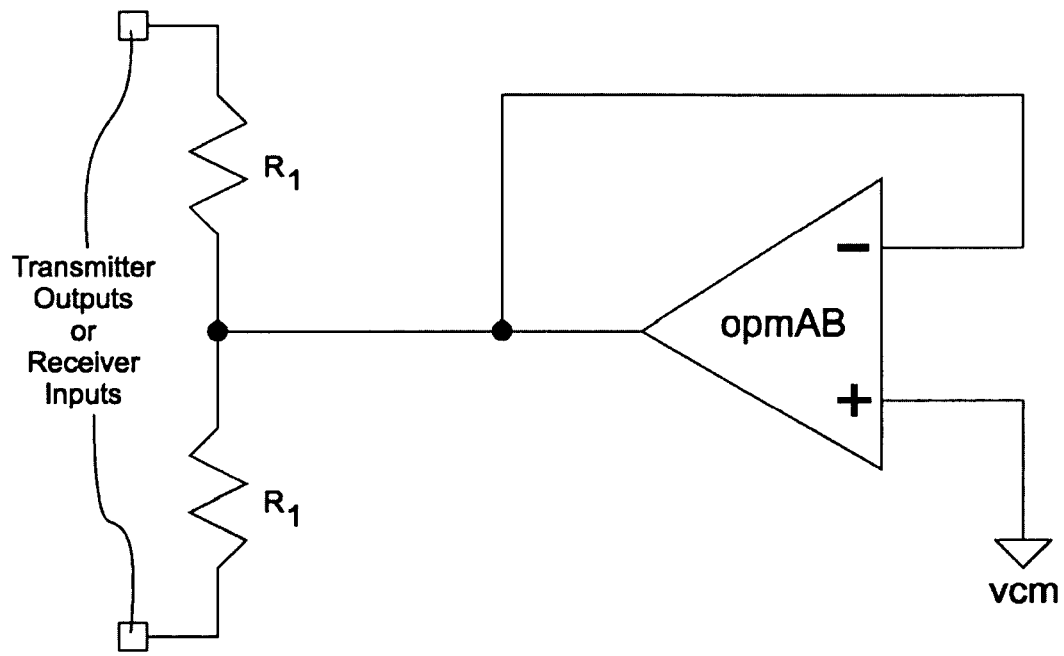
FIG. 11 shows a common mode rejection circuit according to one embodiment of the invention.

One embodiment of such a CMR compensation circuit is shown in FIG. 11, where the common mode voltage of the transmitter outputs and receiver inputs is established by a resistor divider network driven by the common mode amplifier opmAB. In the embodiment illustrated in FIG. 11, amplifier opmAB is configured to provide unity gain feedback by driving the center tap of the resistor divider network to a common mode reference voltage, vcm. For correct operation of the system, vcm is preferably set within an operating supply range. Ideally, vcm should be set to the middle of the operating supply range for optimum signal swing at both the transmitter and receiver. Since the amplitude of the common mode current may be in the range of tens of milliamps (depending on the coupling capacitance across the isolator channel), the resistors are preferably of low impedance (e.g., 10 ohms or less) so that any voltage drop across the resistors during a common mode event does not cause the transmitter outputs and receiver inputs to exceed the operating supply range. (Note, however, that resistors having higher impedance are also contemplated, such as impedances of about 100 ohms or less, or about 250 ohms or less.) If the signal swing at either the transmitter or receiver is allowed to exceed the operating supply range, the data transmitted across the channel will be corrupted. Furthermore, the two resistors must be well matched so that any mismatch in their resistance does not translate into erroneous differential signals. Since the output stage of the common mode amplifier is typically designed to handle common mode currents up to a specified amount, ESD diodes may be placed at the transmitter outputs and receiver inputs to provide further protection to isolator 20 in case the common mode current is larger than the design specifications.

Figure 12:
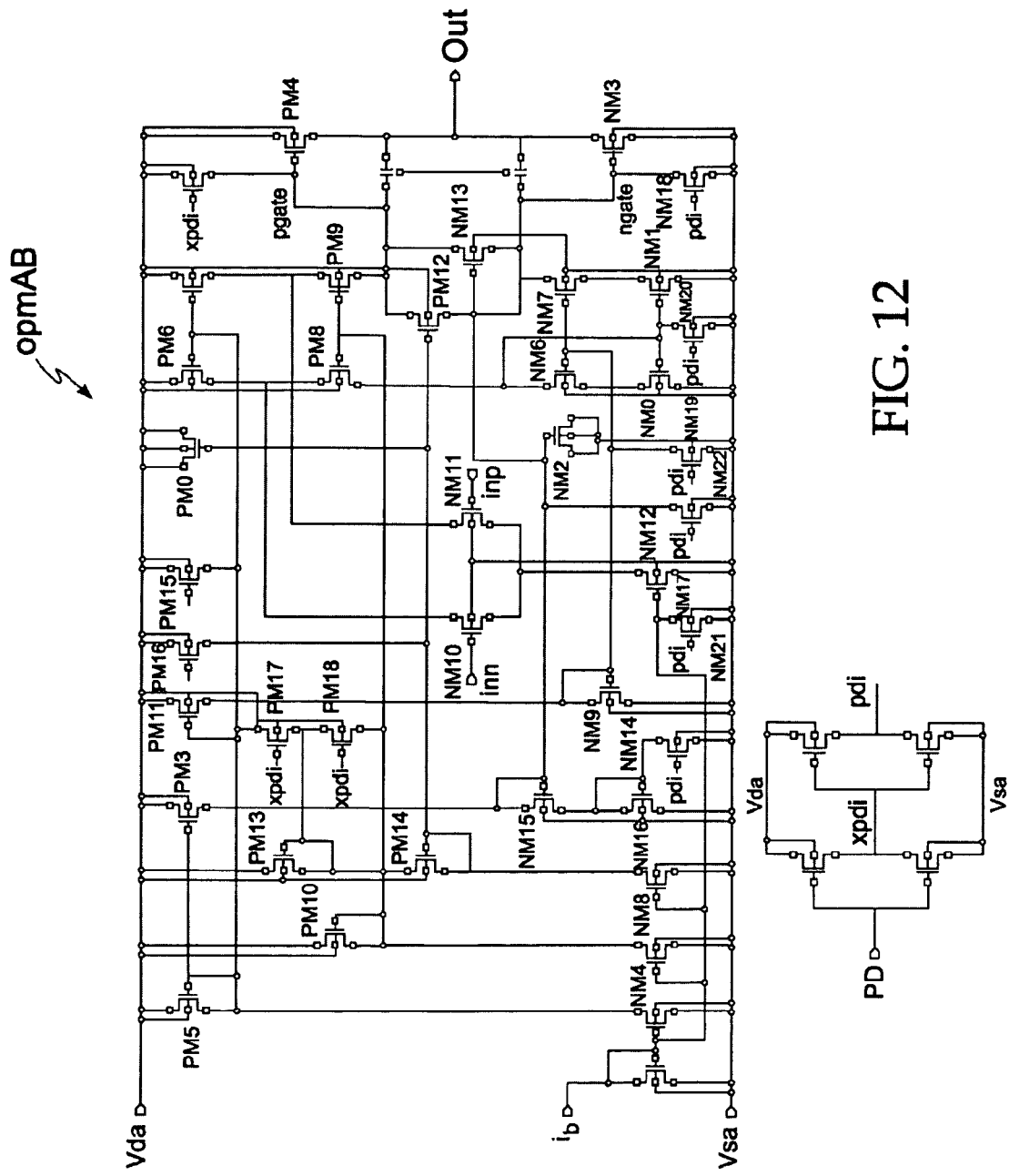
FIG. 12 shows details of one embodiment of a two-stage common mode amplifier according to one embodiment of the invention.

FIG. 12 shows details of one embodiment of two-stage Class AB common mode amplifier opmAB shown in FIG. 11. Amplifier opmAB is a common mode current compensation amplifier operably connected to both transmitter circuit 21 and receiver circuit 22. During a common mode event amplifier opmAB sinks or sources a common mode current that may easily drive the signal level to the plus or minus power supply value with a resulting loss of data signal through the isolation channel.

Continuing to refer to FIG. 12, the left side of the amplifier structure is a bias system that is referenced to a bias current $i_b$. This bias current is generated in another part of the isolator 20. Bias voltages are generated in the left side of FIG. 12. In one embodiment, the input to amplifier opmAB is a pair of NMOS devices which drive a folded cascode structure to the right of the input pair. Such a configuration is used to achieve high gain at a high impedance level connecting to the output stage. See also, for example, pages 752-756 of Paul R. Gray and Robert G. Meyer in "Analysis and Design of Analog Integrated Circuits", $2^{nd}$ edition, John Wiley and Sons, New York, 1984, where similar circuit topologies are discussed in more detail.

Figure 13:
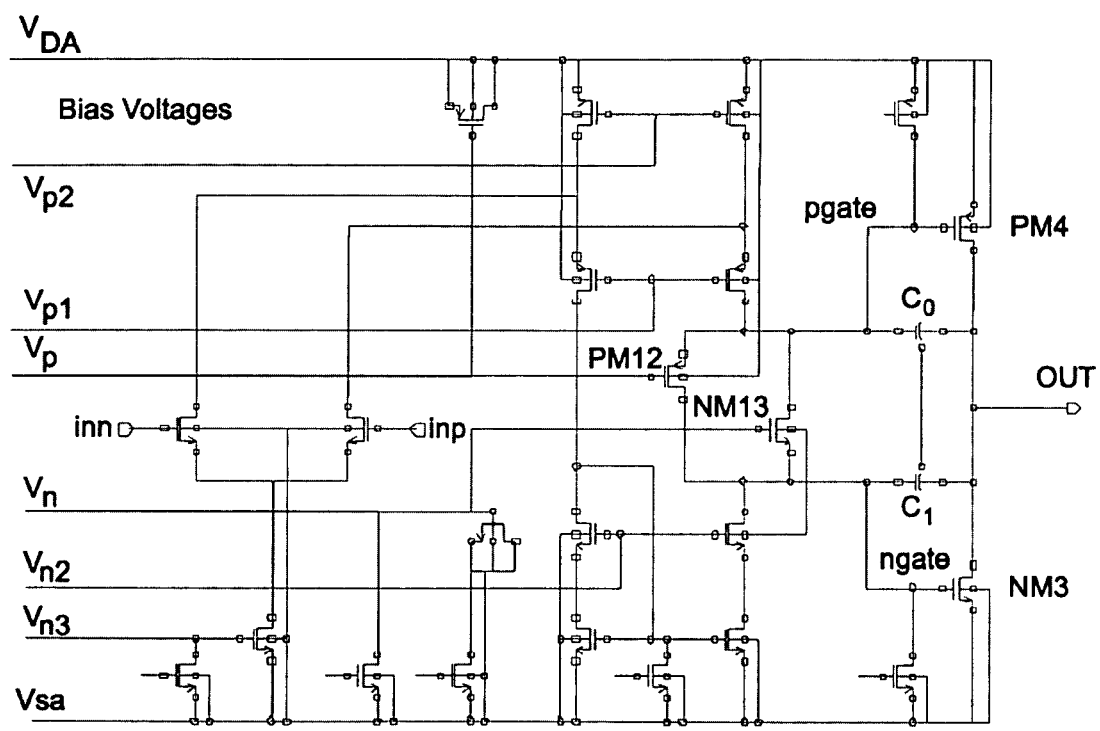
FIG. 13 shows a circuit configured to separate voltage levels between a gate drive for a PMOS output device and an NMOS output device.

FIG. 13 shows a circuit configured to separate voltage levels between a gate drive for PMOS output device PM4, and NMOS output device NM3. The circuit illustrated in FIG. 13 permits large output devices to be biased at a quiescent current level that is less than their full current sourcing or current sinking capabilities (i.e., class AB operation is achieved). The voltage difference between pgate and ngate signals is controlled by PM12 and NM13 devices. If there is a load on the output of the amplifier that requires sourcing or sinking larger amounts of current, either PM12 or NM13 may turn off since either the ngate value becomes higher than vn or the pgate value becomes lower than vp. The device that remains on keeps the first stage cascode structure in the proper operating region and keeps the output device on that does not have a heavy current demand with at least a minimal quiescent current level. PM12 and NM13 devices also have special AC signal properties. Gate bias levels vn and vp are bypassed by capacitors to ground. The two devices function as additional common gate stages that further boost the gain of the first stage at the input to the second stage, i.e., the output devices. An additional feature of this circuit arrangement is that the basic single pole type of roll off for the first stage circuit is preserved. The interface devices are unique since they provide a means of controlling the crossover characteristics for the class AB output stage, and add minimal delay and phase shift to the signals driving the output devices. As a result, the overall amplifier is easier to stabilize in respect of AC signals, and significant extra gain is provided by the amplifier circuit for the intermediate frequency region up to several megahertz.

Continuing to refer to FIG. 13, the common mode output of the amplifier must be able to sink or source very heavy currents during a common mode transient event. The earlier description of common mode transients emphasizes the need for a very fast response to the sharp transients, and to keep the midpoint of the signal near 2.5 volts (or at the middle of the operating range according to one embodiment of the invention). Amplifier performance may also be enhanced through proper design and selection of output devices. To keep costs down, it may be preferred to fabricate the necessary devices in an integrated circuit process that is primarily digital in nature with a few additions for analog capability. If a special process such as BICMOS or a CMOS process with multiple types of device characteristics is required, the number of masking levels and consequently the cost of fabrication may rise to excessive levels. Such specials processes are not suitable for manufacturing a basic isolation part that is optimally sufficiently inexpensive to permit its use in low cost applications. The output device circuitry shown in some of the Figures hereof was selected to employ devices that are available in low-cost CMOS manufacturing processes but that are capable of achieving necessary performance characteristics through careful design.

Continuing to refer to FIG. 13, to achieve the required fast response performance characteristics, isolator 20 must have a large Gm to increase the bandwidth thereof. It has been discovered that a fast response to fast transients may be achieved by using a very short feedback path (in respect of time delay) so that all or most of the transients may be suppressed. The device capabilities of the output devices for conventional CMOS processes are adequate to achieve this result if the feedback element is a capacitor from the output back to the gate of the output NMOS or PMOS device. This very short feedback path provides frequency response for correction of the common mode voltage up to about 2 GHz. Trying to achieve a correction response for the fast transient sensed at the output by using a feedback path through the first stage of the amplifier circuitry has been discovered not to be possible because of excessive time delays introduced thereby. Consequently, in a preferred embodiment the output stage uses local feedback at output devices PM4 and NM3 to accomplish fast transient suppression. Drain to gate capacitors C0 and C1 provide such fast response paths. Capacitors C0 and C1 also serve to stabilize the overall frequency response of the amplifier. There is some flexibility in the choice of capacitors C0 and C1 so the gain bandwidth of the amplifier structure is around 2 MHz. Another aspect of the operational amplifier design shown in FIG. 13 is the local feedback circuitry around output devices PM4 and NM3, which provides transient control. At the same time, the overall response of the amplifier is also relatively easily stabilized because of the first stage cascode architecture.

Many different types of coding schemes may be employed to transmit data signals through galvanic isolator 20 and coil transducer 39. For example, a sequence of two pulses may be employed to represent a rising transition on the user waveform and a single pulse to represent a down transition. (See, for example, "iCoupler Products with isoPower Technology: Signal and Power Transfer Across Isolation Barrier Using Microtransformers" authored by Baoxing Chen and published by ADI Inc.) Our design advantageously employs some aspects of the basic physics of the design and operation of isolator 20 and coil transducer 39 to provide a coding scheme that is relatively simple and capable of operating at a high data rate. Input transitions are converted to single pulses having polarities corresponding to positive-going or negative-going transitions in the input signal. Since there is only one pulse per input transition the maximum transmission frequency is limited by the size of the individual transmitted pulses, not by the extra time needed to create multiple same-polarity pulses for transmission. The differentiation action of the transformer in the isolation channel produces a multiple pulse output for the sequence of input pulses. According to one embodiment of receiver circuit 22, the sequence of pulses also may be checked to verify data integrity.

Figure 14:
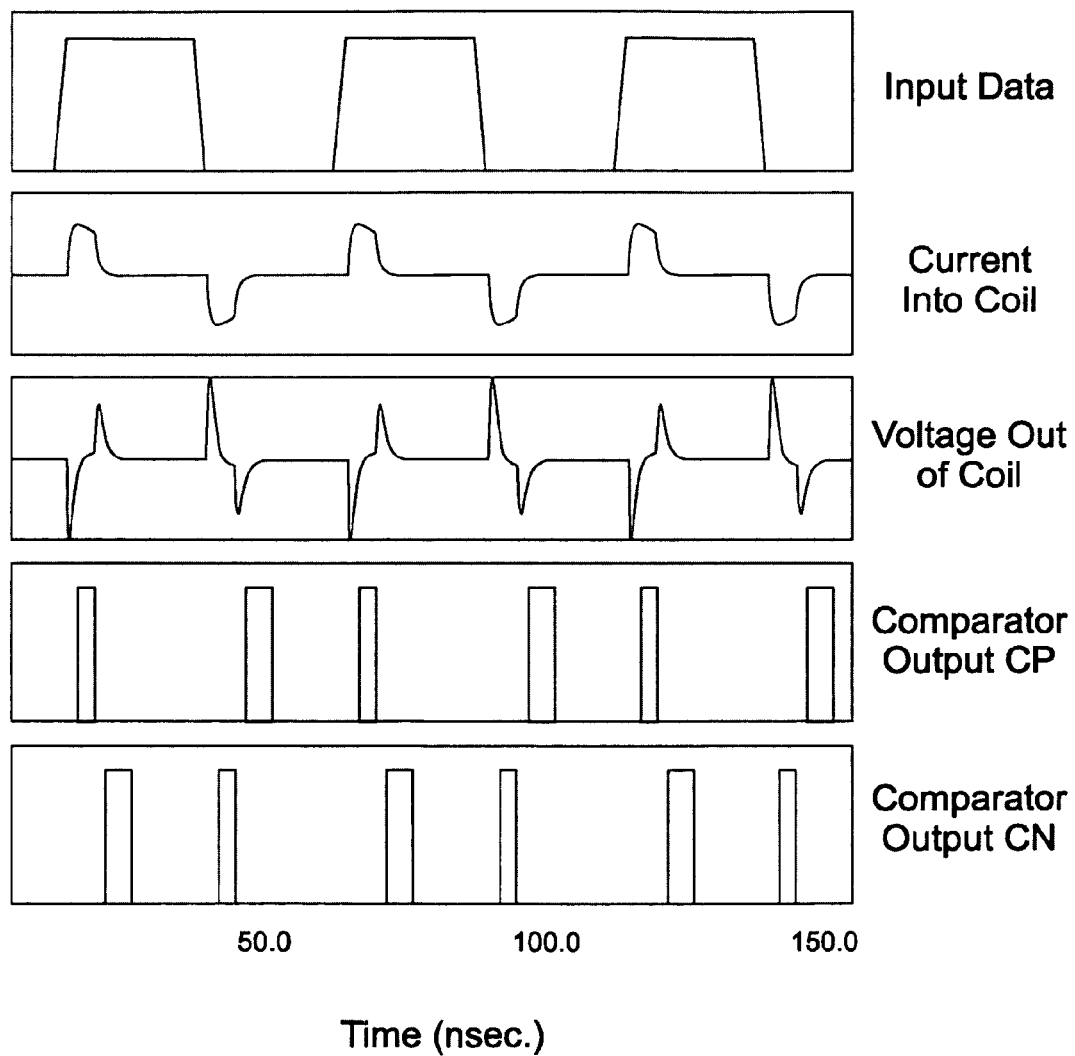
FIG. 14 shows a sequence of pulses as they are transmitted and received by various portions the circuitry disposed in one embodiment of galvanic isolator 20.

One possible pulse sequence is illustrated in FIG. 14. The information transfer through the isolation channel uses a sequence of pulses that is initiated by input signal transitions, converted to current pulses driving primary coil 23 in the transmitter, passed through coil transducer 39 and then differentiated as shown at secondary coil 24. The output voltage peaks are sensed and read by receiver circuit 22, and used to construct an output pulse sequence. To reconstruct the input waveform, comparator outputs are processed through a decoder that produces a positive- or negative-going edge on the rising edge of the second pulse in each sequence of pulse pairs provided to the comparator as positive and negative outputs.

The output of coil transducer 39 is shown in FIG. 14 as "Voltage Out of Coil." Due to the nature of the coil transducer 39, the primary input current pulses ("Input Data" in FIG. 14) are transformed into a sequence of pulses in the secondary output. FIG. 14 shows that "Voltage Out of Coil" signals occur in pulse pairs. A negative pulse is quickly followed by a positive pulse (or a positive pulse is followed by a negative pulse, according to the manner in which coil transducer 39 is wired and configured). In one embodiment, the second pulse in such paired pulses must occur within a short period of time after the first pulse has occurred (e.g., about 10 ns or a similar period of time) to be detected by receiver circuit 22 as a data pulse and not noise. In other words, if the second pulse of the paired pulses does not appear within a predetermined time window after the first of such pulses, then a lone pulse occurring outside the predetermined time window does not represent a valid data pulse, and the pulse will be blocked or ignored.

In addition, and continuing to refer to the "Voltage Out of Coil" signal in FIG. 14, in one embodiment an additional check on the accuracy of the pulses detected by receiver circuit 22 may be performed. A minus (−) pulse followed by a plus (+) pulse must be followed by a plus (+) pulse followed by a minus (−) pulse. (Alternatively, and according to the manner in which coil transducer 39 is wired and configured, a plus (+) pulse must be followed by a minus (−) pulse, which must be followed by a minus (−) pulse followed by a plus (+) pulse.) If such a sequence is not detected by receiver circuit 22, otherwise sensed signals cannot pass through the decoder since they do not represent valid data.

It will now be seen that the novel transmitter and receiver circuits of the invention provide certain advantages not found in prior art galvanic isolators configured to transfer data signals across a dielectric barrier. One such advantage is that the signaling scheme employed in transmitter circuit 21 and receiver circuit 22 is much simpler, more robust and exhibits superior CMR performance respecting prior art signaling methods employed in such devices. Receiver circuit 22 is able to handle excess current and distinguish real data signals from noise signals. Both such performance characteristics are required if high CMR performance is to be attained in the presence of interfering noise pulses. By way of comparison, see the relatively complicated data signal transfer schemes described in U.S. Patent Publication No. 2005/0057277 to Chen et al. entitled "Signal Isolators Using Micro-Transformers" dated Mar. 17, 2005 and U.S. Patent Publication No. 2005/0272378 to Dupuis entitled "Spread Spectrum Isolator" dated Dec. 8, 2005. It will be seen that the foregoing Chen and Dupuis references employ considerably more complicated data encoding and decoding schemes than those described herein.

Figure 15:
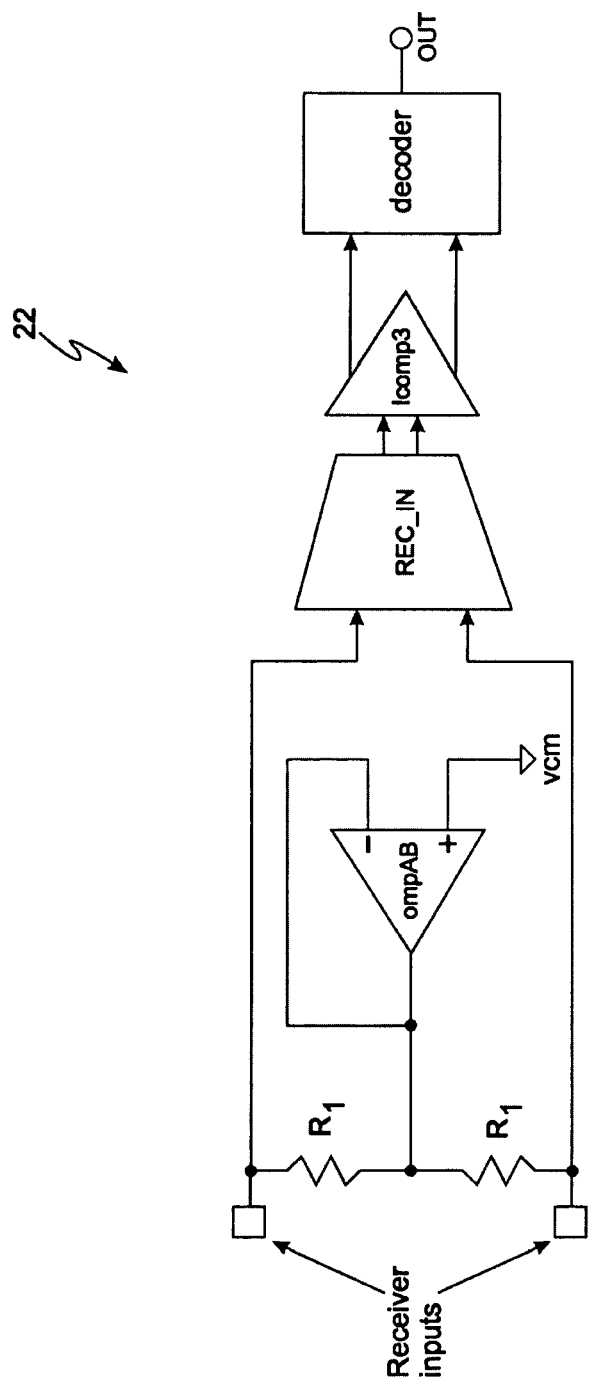
FIG. 15 shows a block diagram of receiver circuit 22 according to one embodiment of the invention.

Receiver circuit 22 is preferably configured to monitor differential signals transmitted across the transformer and produce an output that is a minimally delayed version of the input signal provided to transmitter circuit 21. (In some embodiments of the invention, the amount of this delay can be minimized rather easily owing to the particularly efficacious, simple and effective coding and decoding schemes described herein.) Although the receiver output is a delayed version of the transmitter input, it should nevertheless preserve the pulse width of the input signal so that signal integrity may be maintained. The common mode voltage of the receiver inputs may be set using the common mode schemes described above for transmitter common-mode signals. As shown in FIG. 15, in one embodiment receiver circuit 22 comprises a fully differential high gain input stage, REC_IN, a fully differential high speed comparator, icomp3, and a decoder stage to reconstruct the received signals and thereby provide a faithful accurate reproduction of the input signal provided to galvanic isolator 20.

Figure 16:
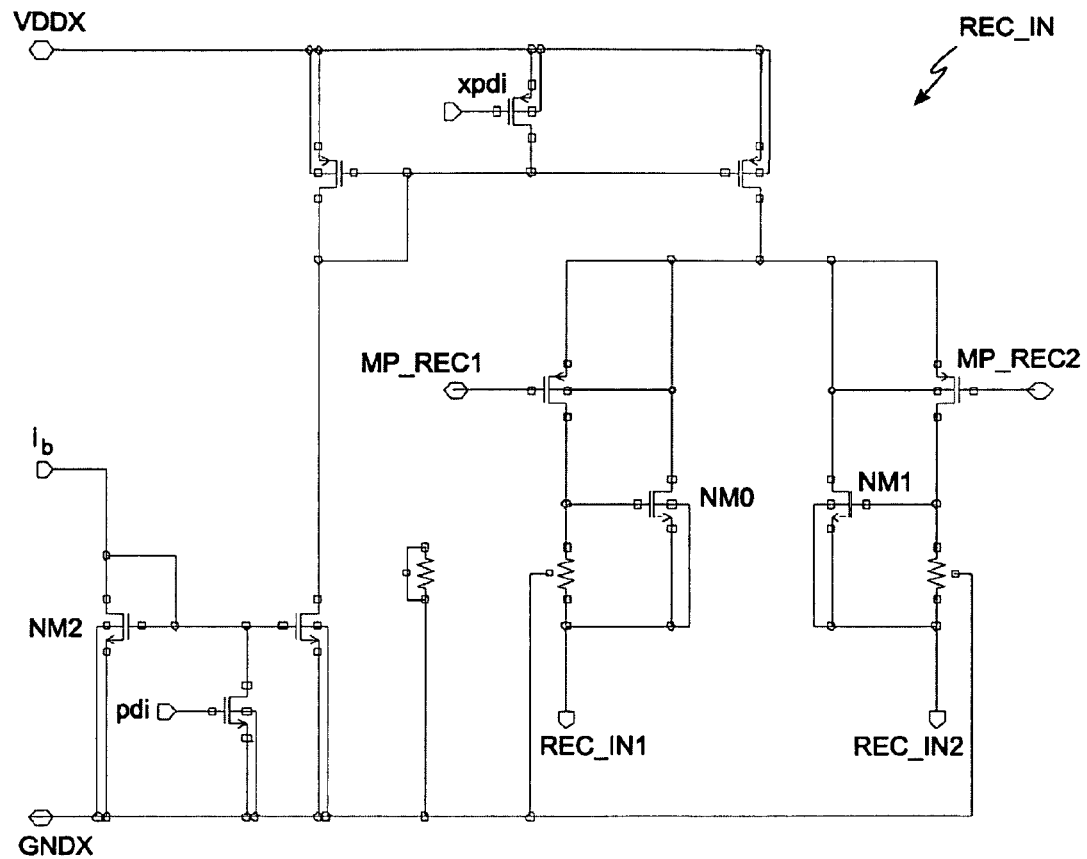
FIG. 16 provides details of input stage REC_IN of FIG. 15 according to one embodiment of the invention.

FIG. 16 provides details of one embodiment of input stage REC_IN of FIG. 15. The input structure comprises a PMOS differential input pair, MP_REC1 and MP_REC2. In addition, two NMOS devices, NM0 and NM1, reinforce the transconductance of the input pair. This allows the input stage to achieve a high transconductance value at a much lower current. When a differential voltage appears at the inputs REC1 and REC2, a differential output current is produced at the nodes REC_IN1 and REC_IN2, which then drives the subsequent comparator stage. The differential output current is a product of the transconductance and the differential input voltage. Hence it is desirable to achieve a high transconductance to maximize the current gain of this stage so that sufficient signal levels are provided to the comparator.

Figure 17:
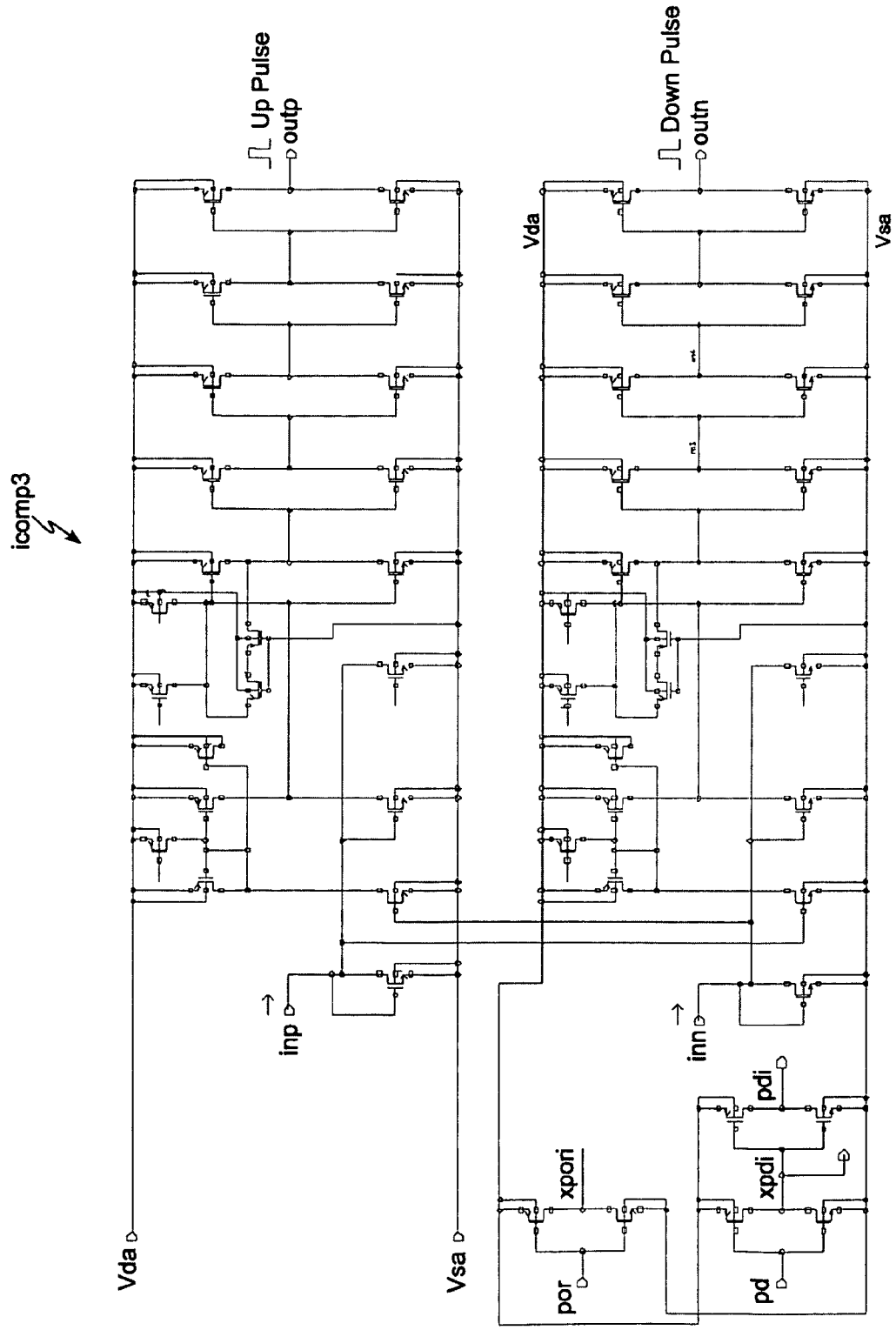
FIG. 17 provides details of comparator icomp3 of FIG. 15 according to one embodiment of the invention.

FIG. 17 shows details of one embodiment of comparator circuit icomp3 shown in FIG. 13. In the embodiment illustrated in FIG. 17, comparator icomp3 adopts a fully differential design with a cross-coupled input structure to provide good common mode rejection performance characteristics. High common mode rejection is important not only for noise rejection during normal operation, but also during a common mode event to ensure that common mode transients do not transform into differential signals and disrupt receiver operation. The comparator input stage shown in FIG. 17 incorporates a hysteresis window which further improves system noise immunity. Following the input stage is a series of inverters that provide a high gain path to the outputs thereof.

Receiver circuit 22 is preferably configured to extend the bandwidth of the unit beyond the capability of circuits typically employed in similar applications. Receiver circuit 22 preferably boosts the signals received thereby so they have a sufficiently large voltage excursion to permit a predetermined threshold level to be compared thereto. If the signal exceeds the predetermined threshold, processing continues using follow-on circuitry.

Amplification at higher frequencies typically requires a series of voltage gain stages with moderate gain for each stage so that overall bandwidth is maintained. Difficulties are presented in such a strategy, however, when conventional CMOS manufacturing processes are employed. The gain bandwidths of the devices available in such CMOS processes are typically marginal. Additionally, multiple stages in series may be required to obtain a desired gain factor of, for example, between about 10× to about 20×, which would likely introduce time delay and width distortion of the pulses being amplified.

Figure 18:
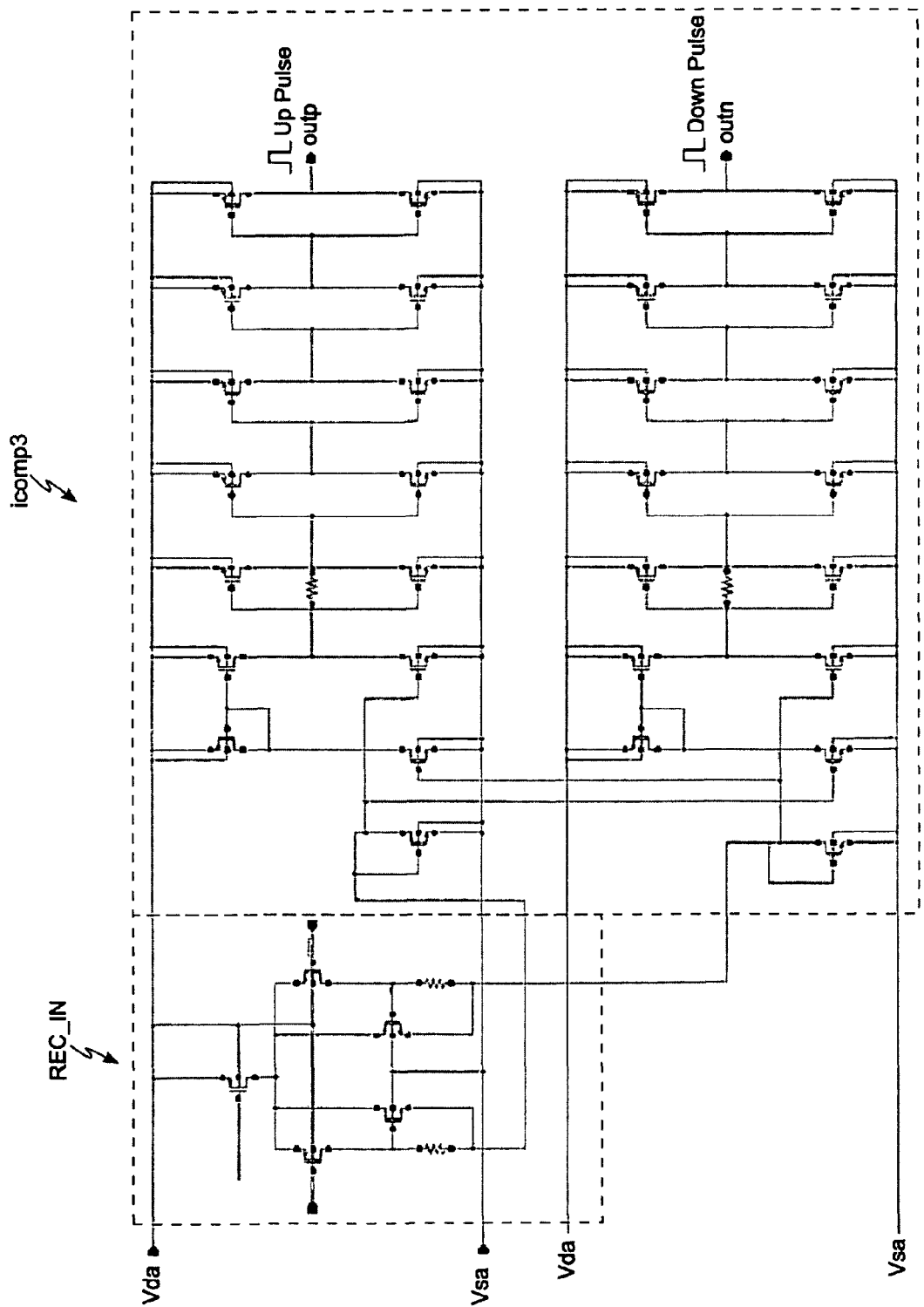
FIG. 18 provides details of comparator icomp3 of FIG. 15 according to another embodiment of the invention.

An alternative approach that provides solutions to at least some of the foregoing problems is to use a current mode design of the type illustrated in FIG. 18, where a signal path version of a preamp with a comparator is illustrated. The preamp stage, which uses enhanced PMOS input devices, is on the left. The comparator structure is on the right. The connection between the input and the comparator structure is accomplished with a cross coupled current mirror structure. The cross coupled structure has two important characteristics. Cross coupling is required to reject common mode signals. In many cases common mode perturbations may have amplitudes or other signal characteristics similar to those of signals of interest. These common mode perturbations are undesired and are preferably suppressed. Important information about input transitions in the input signals is contained in the differential portions of such signals. The relative sizes of devices for straight ahead connections versus cross coupled devices also puts a hysteresis window into the signal path and reduces the system noise immunity. Part of the signal current is mirrored again with PMOS devices so that selected nodes are driven by both N and P current mirror output devices. These nodes are of higher impedance and have small capacitive loading to preserve as much bandwidth as possible.

The first "inverter" stage shown in FIG. 18 is actually an amplifier stage that increases signal amplitude. The follow-on stages perform additional amplification and limiting resulting in fast transition of output pulses. The simplicity of the inverter stages is important since they permit a very fast comparator with high gain and good limiting characteristics to be provided.

The combination of REC_IN and icomp3 circuits is configured to provide a sequence of output pulse patterns that contain edge information regarding the input signal being transmitted across the dielectric barrier. See FIG. 14.

Figure 19:
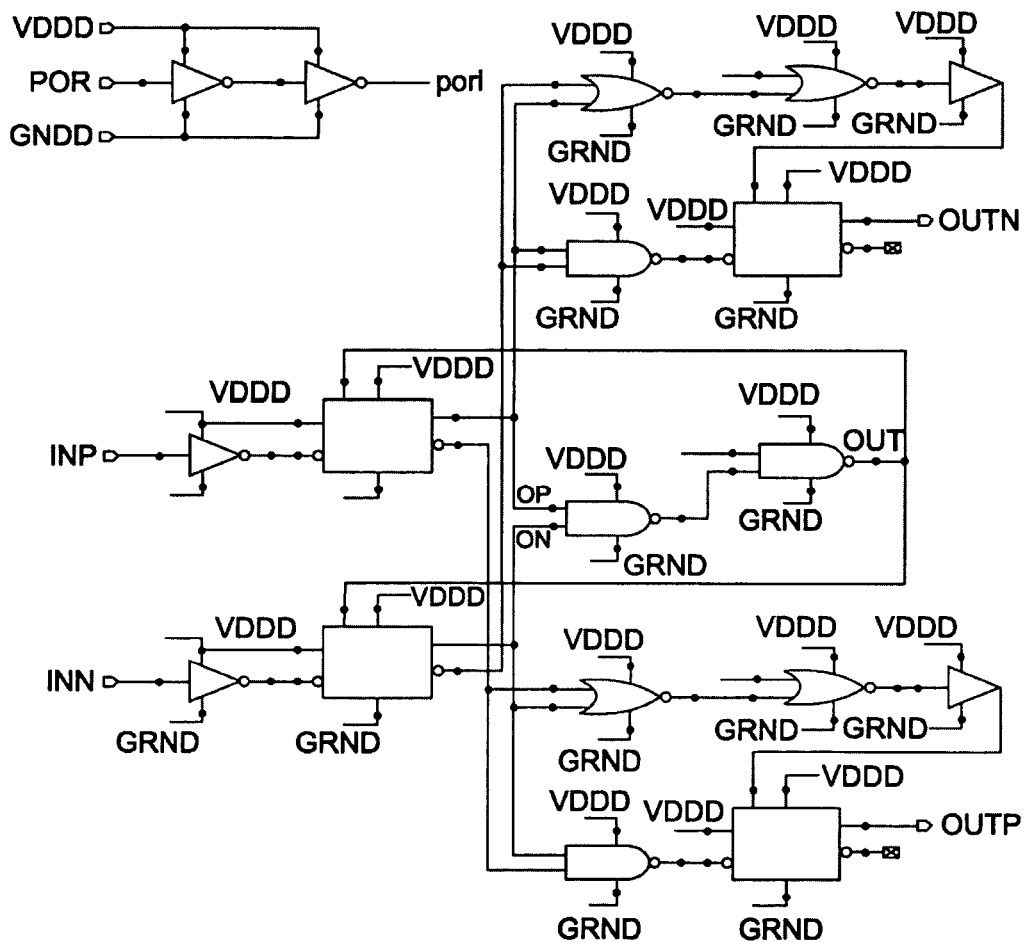
FIG. 19 shows a decoder circuit following comparator icomp3 circuit of FIG. 15 according to one embodiment of the invention.

FIG. 19 shows one embodiment of the decoder circuit following the comparator icomp3 circuit shown in FIG. 15. The decoder circuit takes the differential outputs from the comparator and reconstructs a faithful and accurate reproduction of the input signal provided to galvanic isolator 20. The decoder circuit is configured to determine how a sequence of UP and DOWN signals may be employed to provide rising or falling edges corresponding to the rising or falling edges of the input signals provided to galvanic isolator 20 and transmitted across substrate 33 and coil transducer 39. The result is that the final waveform provided by the output of the decoder circuit is substantially identical to the input signal provided to galvanic isolator 20.

As the transformer only transmits AC or oscillatory signal information across the channel, a DC refresh circuit is preferably included in the system to ensure correct DC levels when no transitions are present in the data signals being transmitted. In one embodiment, the DC refresh circuit comprises a watchdog timer disposed in transmitter circuit 21 that is configured to monitor input signal transitions. If no signal transition occurs after a certain predetermined or programmed timeout or period of time, the watchdog circuit will initiate internal "keep-alive" pulses to keep the channel active so that the output DC state is maintained. On the other hand, a watchdog circuit may also be included in receiver circuit 22 to monitor signal transitions at the receiver inputs. If no signal transition occurs after a certain predetermined or programmed timeout or period of time, which is usually longer than the timeout of the transmitter watchdog, the receiver watchdog circuit will set the output to a default state. In one embodiment, the "keep-alive" pulses utilize a double edge encoding scheme. For example, the refresh for a high level is a 1 to 0, followed by a 0 to 1. The refresh for a low level is a 0 to 1, followed by a 1 to 0. The internal "keep-alive" pulses travel through the same channel as the external input signal so there is no need for a separate refresh channel. Such "keep-alive" pulses may eventually be filtered by receiver circuit 22 and not appear at the final output.

Note that the terms "vertical" and "horizontal" employed herein are intended to refer to the relative orientations of capacitor planes as they relate to underlying or overlying ground plane substrates 60. Thus, while a device made in accordance with the teachings of the invention might, in fact, have co-planar digital data communication electrodes disposed in a single plane, and the single plane is vertically oriented but is parallel or substantially parallel to the ground plane substrate, such a device would nevertheless fall within the scope of the invention.

Note also that according to one embodiment of the invention, a first substrate is provided atop which first and second coils 23 and 24 are disposed with an intervening dielectric barrier or second substrate disposed therebetween. In such an embodiment, therefore, the first substrate is positioned beneath both first coil 23 and second coil 24, where the coils and the second substrate are fabricated on top of the first substrate.

Note further that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A coil transducer, comprising:
a generally planar electrically insulating substrate comprising opposing upper and lower surfaces, the substrate comprising an electrically insulating, non-metallic, non-semiconductor low dielectric loss material having a dielectric loss tangent at room temperature that is less than or equal to 0.05;
a first electrical conductor forming a first coil, the first coil being disposed upon, in or near the upper surface, and
a second electrical conductor forming a second coil, the second coil being disposed upon, in or near the lower surface;
wherein the first coil is separated from the second coil by at least portions of the substrate, no electrical conductors, vias or terminals are located in portions of the substrate disposed between the first coil and the second coil, the first and second coils are spatially arranged and configured respecting one another such that at least one of power and data signals may be transmitted by the first coil to the second coil across a dielectric barrier comprising the non-semiconductor low dielectric loss material disposed therebetween, the dielectric barrier exceeds about 1 mil in thickness, and a breakdown voltage between the first coil and the second coil exceeds 2,000 volts RMS.

2. The coil transducer of claim 1, wherein the substrate is configured to impart substantial mechanical rigidity and strength to the coil transducer.

3. The coil transducer of claim 1, wherein the substrate material further comprises a material selected from the group consisting of one or more of fiberglass, glass, ceramic, polyimide, polyimide film, a polymer, an organic material, a flex circuit material, epoxy, epoxy resin, a printed circuit board material, PTFE and glass, PTFE and ceramic, PTFE, glass and ceramic, plastic and thermoset plastic.

4. The coil transducer of claim 1, wherein the coil transducer comprises a plurality of layers in addition to the substrate, at least one of the layers comprising the low dielectric loss material.

5. The coil transducer of claim 1, wherein the breakdown voltage between the first coil and the second coil exceeds 2,000 volts RMS when applied over a time period of about one minute, exceeds 2,000 volts RMS when applied over a time period of about six minutes, or exceeds 2,000 volts RMS when applied over a time period of 24 hours.

6. The coil transducer of claim 1, wherein the breakdown voltage between the first coil and the second coil exceeds 5,000 volts RMS when applied over a time period of about one minute, exceeds 5,000 volts RMS when applied over a time period of about six minutes, or exceeds 5,000 volts RMS when applied over a time period of 24 hours.

7. The coil transducer of claim 1, wherein at least one of the coil transducer and the substrate has a thickness between upper and lower surfaces thereof ranging between about 0.5 mils and about 25 mils, between about 1 mil and about 25 mils, or between about 1.5 mils and about 25 mils.

8. The coil transducer of claim 1, further comprising at least one of an input lead frame and an output lead frame connected to the coil transducer such that electrically conductive portions of the input and output lead frames do not extend beneath the coil transducer to locations directly beneath the first or second coils.

9. The coil transducer of claim 1, further comprising an input lead frame and an output lead frame connected to the coil transducer such that the input lead frame is mechanically connected to an upper side of the coil transducer and the output lead frame is mechanically connected to a bottom side of the coil transducer, the bottom side opposing the top side.

10. The coil transducer of claim 1, further comprising an input lead frame and an output lead frame connected to the coil transducer such that the input and output lead frames are both mechanically connected to one of an upper side of the coil transducer and a bottom side of the coil transducer.

11. The coil transducer of claim 1, further comprising an input lead frame and an output lead frame connected to the galvanic isolator, and a moldable electrically insulating material encapsulating at least portions of the coil transducer and the input and output lead frames.

12. The coil transducer of claim 1, further comprising electrically insulating silicone disposed thereabout, thereover or thereunder.

13. The coil transducer of claim 1, wherein the coil transducer is configured to operate as one of a data transfer device and a power transfer device.

14. The coil transducer of claim 1, wherein the first coil is operably connected to a transmitter circuit and the second coil is operably connected to a receiver circuit.

15. The coil transducer of claim 14, wherein an integrated circuit comprises at least one of the transmitter circuit and the receiver circuit.

16. A coil transducer, comprising:
a generally planar substrate comprising opposing upper and lower surfaces, the substrate comprising an electrically insulating, non-metallic, non-semiconductor, low dielectric loss material comprising one or more of fiberglass, glass, ceramic, polyimide, polyimide film, a polymer, an organic material, a flex circuit material, epoxy, epoxy resin, a printed circuit board material, PTFE and glass, PTFE and ceramic, PTFE, glass and ceramic, plastic and thermoset plastic;
a first electrical conductor forming a first coil, the first coil being disposed upon, in or near the upper surface, and
a second electrical conductor forming a second coil, the second coil being disposed upon, in or near the lower surface;
wherein the first coil is separated from the second coil by at least portions of the substrate, no electrical conductors, vias or terminals are located in portions of the substrate disposed between the first coil and the second coil, the first and second coils are spatially arranged and configured respecting one another such that at least one of power and data signals may be transmitted by the first coil to the second coil across a dielectric barrier comprising the non-semiconductor low dielectric loss material disposed therebetween, the dielectric barrier exceeds about 1 mil in thickness, and a breakdown voltage between the first coil and the second coil exceeds 2,000 volts RMS.

17. The coil transducer of claim 16, wherein the substrate imparts substantial mechanical rigidity and strength to the coil transducer.

18. The coil transducer of claim 16, wherein the substrate comprises a plurality of layers in addition to the substrate, at least one of the layers comprising the low-loss dielectric material.

19. The coil transducer of claim 16, wherein a breakdown voltage between the first coil and the second coil exceeds 2,000 volts RMS when applied over a time period of about one minute, exceeds 2,000 volts RMS when applied over a time period of about six minutes, or exceeds 2,000 volts RMS when applied over a time period of 24 hours.

20. The coil transducer of claim 16, wherein a breakdown voltage between the first coil and the second coil exceeds 5,000 volts RMS when applied over a time period of about one minute, exceeds 5,000 volts RMS when applied over a time period of about six minutes, or exceeds 5,000 volts RMS when applied over a time period of 24 hours.

21. The coil transducer of claim 16, wherein at least one of the coil transducer and the substrate has a thickness between upper and lower surfaces thereof ranging between about 0.5 mils and about 25 mils, between about 1 mil and about 25 mils, or between about 1.5 mils and about 25 mils.

22. The coil transducer of claim 16, further comprising at least one of an input lead frame and an output lead frame connected to the coil transducer such that electrically conductive portions of the input and output lead frames do not extend beneath the substrate to locations directly beneath the first or second coils.

23. The coil transducer of claim 16, further comprising an input lead frame and an output lead frame connected to the coil transducer such that the input lead frame is mechanically connected to an upper side of the coil transducer and the output lead frame is mechanically connected to a bottom side of the coil transducer, the bottom side opposing the top side.

24. The coil transducer of claim 16, further comprising an input lead frame and an output lead frame connected to the coil transducer such that the input and output lead frames are both mechanically connected to one of an upper side of the coil transducer and a bottom side of the coil transducer.

25. The coil transducer of claim 16, further comprising an input lead frame and an output lead frame connected to the coil transducer, and a moldable electrically insulating material encapsulating at least portions of the coil transducer and the input and output lead frames.

26. The coil transducer of claim 16, further comprising electrically insulating silicone disposed thereabout, thereover or thereunder.

27. The coil transducer of claim 16, wherein the coil transducer is configured to operate as one of a data transfer device and a power transfer device.

28. The coil transducer of claim 16, wherein the first coil is operably connected to a transmitter circuit and the second coil is operably connected to a receiver circuit.

29. A method of making a coil transducer, comprising:
providing a generally planar electrically insulating substrate comprising opposing upper and lower surfaces, the substrate comprising an electrically insulating, non-metallic, non-semiconductor low dielectric loss material having a dielectric loss tangent at room temperature that is less than or equal to 0.05;
providing a first electrical conductor forming a first coil, the first coil being disposed on the upper surface;
providing a second electrical conductor forming a second coil, the second coil being disposed on the lower surface, and
configuring the first coil, second coil and the substrate in respect of one another such that the first coil is separated from the second coil by at least portions of the substrate, no electrical conductors, vias or terminals are located in portions of the substrate disposed between the first coil and the second coil, the first and second coils are spatially arranged and configured respecting one another such that at least one of power and data signals may be transmitted by the first coil to the second coil across a dielectric barrier comprising the non-semiconductor low dielectric loss material disposed therebetween, and a breakdown voltage between the first coil and the second coil exceeds 2,000 volts RMS.

30. A method of making a coil transducer, comprising:
providing a generally planar substrate comprising opposing upper and lower surfaces, the substrate comprising an electrically insulating, non-metallic, non-semiconductor, low dielectric loss material comprising one or more of fiberglass, glass, ceramic, polyimide, polyimide film, a polymer, an organic material, a flex circuit material, epoxy, epoxy resin, a printed circuit board material, PTFE and glass, PTFE and ceramic, PTFE, glass and ceramic, plastic and thermoset plastic;
providing a first electrical conductor forming a first coil, the first coil being disposed on the upper surface;
providing a second electrical conductor forming a second coil, the second coil being disposed on the lower surface, and
configuring the first coil, second coil and the substrate in respect of one another such that the first coil is separated from the second coil by at least portions of the substrate, no electrical conductors, vias or terminals are located in portions of the substrate disposed between the first coil and the second coil, the first and second coils are spatially arranged and configured respecting one another such that at least one of power and data signals may be transmitted by the first coil to the second coil across a dielectric barrier comprising the non-semiconductor low dielectric loss material disposed therebetween, and a breakdown voltage between the first coil and the second coil exceeds 2,000 volts RMS.

\* \* \* \* \*